(12) United States Patent
Date

(10) Patent No.: US 11,238,941 B2
(45) Date of Patent: Feb. 1, 2022

(54) SEMICONDUCTOR MEMORY DEVICE

(71) Applicant: Kioxia Corporation, Minato-ku (JP)

(72) Inventor: Hiroki Date, Chigasaki (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 17/007,691

(22) Filed: Aug. 31, 2020

(65) Prior Publication Data

US 2021/0241837 A1  Aug. 5, 2021

(30) Foreign Application Priority Data

Feb. 5, 2020 (JP) .............................. JP2020-017855

(51) Int. Cl.

| | | |
|---|---|---|
| G11C 16/04 | (2006.01) | |
| G11C 16/26 | (2006.01) | |
| G11C 16/34 | (2006.01) | |
| G11C 16/32 | (2006.01) | |
| G11C 16/08 | (2006.01) | |
| G11C 16/10 | (2006.01) | |
| H01L 25/18 | (2006.01) | |
| H01L 27/11582 | (2017.01) | |
| H01L 27/11565 | (2017.01) | |

(52) U.S. Cl.
CPC .......... *G11C 16/26* (2013.01); *G11C 16/0483* (2013.01); *G11C 16/08* (2013.01); *G11C 16/10* (2013.01); *G11C 16/32* (2013.01); *G11C 16/3459* (2013.01); *H01L 25/18* (2013.01); *H01L 27/11565* (2013.01); *H01L 27/11582* (2013.01)

(58) Field of Classification Search
CPC ......... G11C 16/26; G11C 16/08; G11C 16/10; G11C 16/32; G11C 16/0483; G11C 16/3459
See application file for complete search history.

(56) References Cited

U.S. PATENT DOCUMENTS

| | | | | |
|---|---|---|---|---|
| 7,184,309 B2 * | 2/2007 | Matsunaga | ........ | G11C 16/0483 365/185.17 |
| 7,924,644 B2 * | 4/2011 | Park | ...................... | G11C 11/404 365/222 |
| 9,202,575 B2 * | 12/2015 | Yamamoto | ......... | G11C 16/0483 |
| 9,666,296 B1 | 5/2017 | Maejima | | |
| 10,861,536 B2 * | 12/2020 | Kamata | ............... | G11C 11/5642 |

FOREIGN PATENT DOCUMENTS

JP        2017-157260 A        9/2017

* cited by examiner

*Primary Examiner* — Pho M Luu
(74) *Attorney, Agent, or Firm* — Oblon, McClelland, Maier & Neustadt, L.L.P.

(57) ABSTRACT

A semiconductor memory device comprises a bit line and source line, a first memory cell and first and second transistors connected therebetween, a second memory cell and third and fourth transistors connected therebetween, and first through fifth wirings connected to the first and the second memory cells and gate electrodes of the first to the fourth transistors. At a first timing of a read operation, voltages of the first through third wirings are larger than voltages of the fourth and fifth wirings. At a second timing, voltages of the second and third wirings are larger than voltages of the fourth and fifth wirings. At a third timing, voltages of the fourth and fifth wirings are larger than their voltages at the second timing. At a fourth timing, voltages of the second and third wirings are larger than a voltage of the fourth wiring.

19 Claims, 31 Drawing Sheets

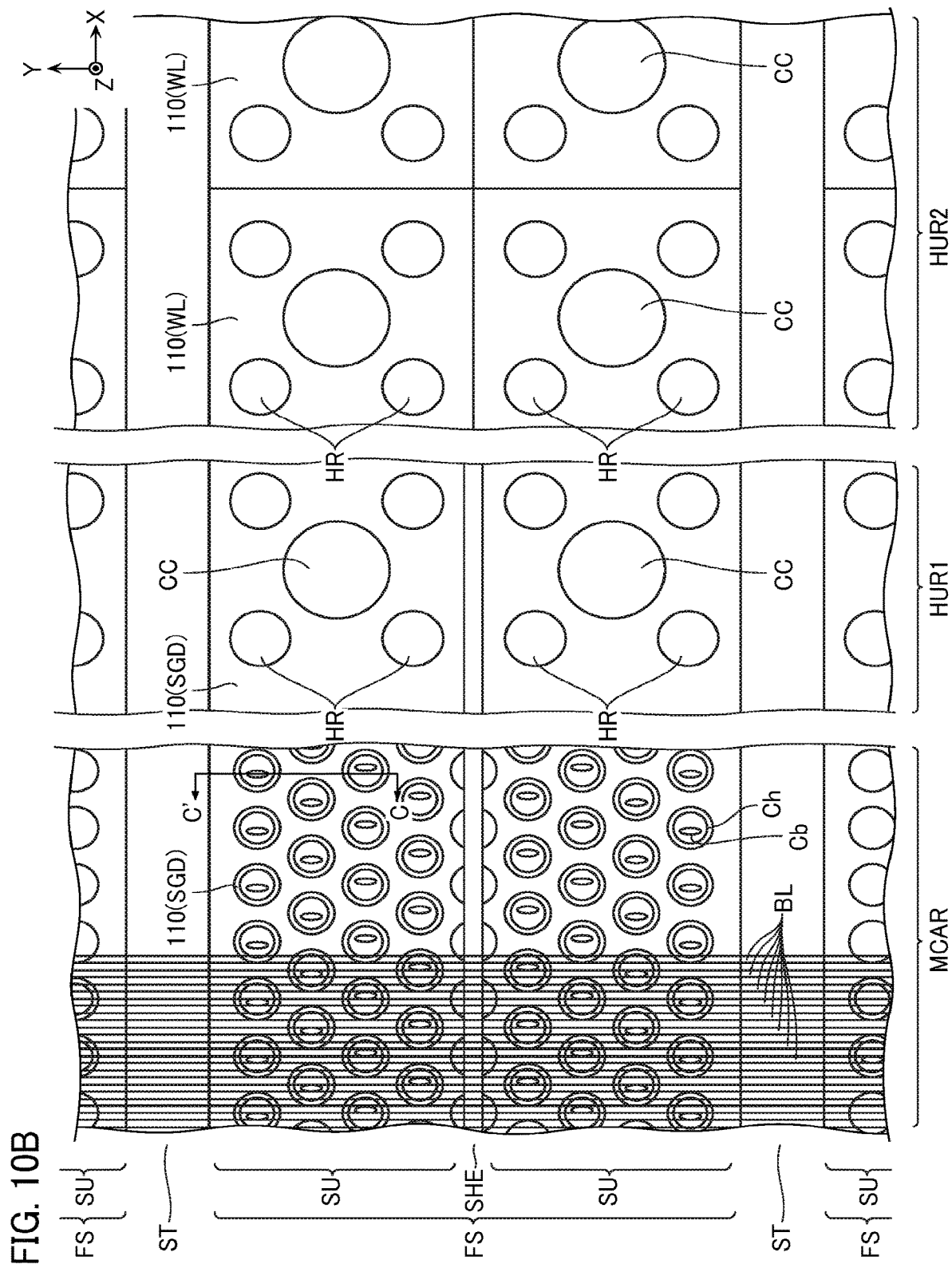

SEMICONDUCTOR MEMORY DEVICE

CROSS-REFERENCE TO RELATED APPLICATIONS

This application is based upon and claims the benefit of Japanese Patent Application No. 2020-017855, filed on Feb. 5, 2020, the entire contents of which are incorporated herein by reference.

BACKGROUND

Field

Embodiments described below relate to a semiconductor memory device.

Description of the Related Art

There is known a semiconductor memory device that comprises: a bit line and a source line; and a first select transistor, a memory cell, and a second select transistor that are connected in series between the bit line and the source line.

BRIEF DESCRIPTION OF THE DRAWINGS

FIG. 10B is a schematic enlarged view of each of regions shown in FIG. 10A.

DETAILED DESCRIPTION

Figure 1:
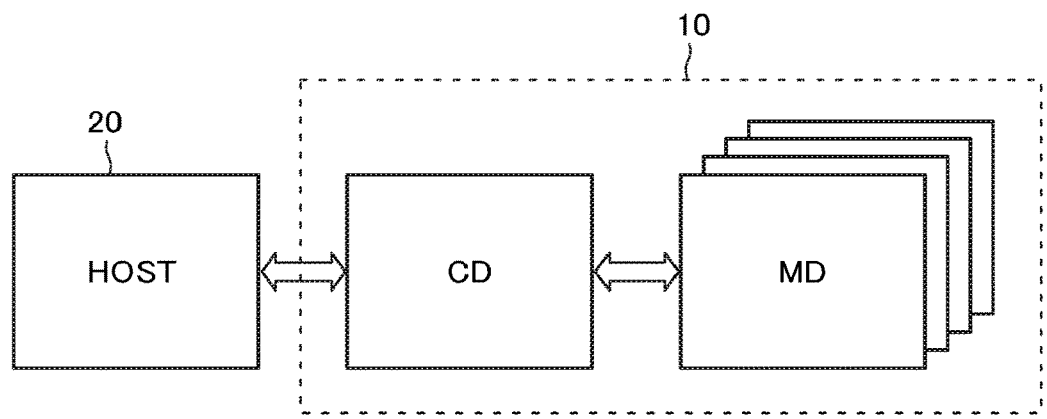
FIG. 1 is a schematic block diagram showing a configuration of a memory system 10 according to a first embodiment.

A semiconductor memory device according to an embodiment comprises a bit line and a source line. Moreover, this semiconductor memory device comprises: a first memory cell; a first select transistor connected between the first memory cell and the bit line; and a second select transistor connected between the first memory cell and the source line. Moreover, this semiconductor memory device comprises: a second memory cell; a third select transistor connected between the second memory cell and the bit line; and a fourth select transistor connected between the second memory cell and the source line. Moreover, this semiconductor memory device comprises: a first wiring electrically connected to the first memory cell and the second memory cell; a second wiring connected to a gate electrode of the first select transistor; a third wiring connected to a gate electrode of the second select transistor; a fourth wiring connected to a gate electrode of the third select transistor; and a fifth wiring connected to a gate electrode of the fourth select transistor. Moreover, at a first timing, of a read operation on the first memory cell, voltages of the first wiring, the second wiring, and the third wiring are larger than voltages of the fourth wiring and the fifth wiring; at a second timing later than the first timing, of the read operation on the first memory cell, a voltage of the first wiring is smaller than a voltage of the first wiring at the first timing, and voltages of the second wiring and the third wiring are larger than voltages of the fourth wiring and the fifth wiring; at a third timing later than the second timing, of the read operation on the first memory cell, voltages of the fourth wiring and the fifth wiring are larger than voltages of the fourth wiring and the fifth wiring at the second timing; and at a fourth timing later than the third timing, of the read operation on the first memory cell, a voltage of the first wiring is smaller than a voltage of the first wiring at the first timing, and voltages of the second wiring and the third wiring are larger than a voltage of the fourth wiring.

Next, semiconductor memory devices according to embodiments will be described in detail with reference to the drawings. Note that the following embodiments are merely examples, and are not shown with the intention of limiting the present invention. Moreover, the following drawings are schematic, and, for convenience of description, some configurations, and so on, thereof will sometimes be omitted. Moreover, portions that are common to a plurality of embodiments will be assigned with the same symbols, and descriptions thereof will sometimes be omitted.

Moreover, when a "semiconductor memory device" is referred to in the present specification, it will sometimes mean a memory die, and will sometimes mean a memory system including a control die, of the likes of a memory chip, a memory card, or an SSD. Furthermore, it will sometimes mean a configuration including a host computer, of the likes of a smartphone, a tablet terminal, or a personal computer.

Moreover, in the present specification, when a first configuration is said to be "electrically connected" to a second configuration, the first configuration may be connected to the second configuration directly, or the first configuration may be connected to the second configuration via the likes of a wiring, a semiconductor member, or a transistor. For example, even when, in the case of three transistors having been serially connected, the second transistor is in an OFF state, the first transistor is still "electrically connected" to the third transistor.

Moreover, in the present specification, when a first configuration is said to be "connected between" a second configuration and a third configuration, it will sometimes mean that the first configuration, the second configuration, and the third configuration are connected in series, and the first configuration is provided in a current path of the second configuration and the third configuration.

Moreover, in the present specification, when a circuit, or the like, is said to "cause" two wirings, or the like "to be electrically continuous", this will sometimes mean, for example, that this circuit, or the like, includes a transistor, or the like, that this transistor, or the like, is provided in a current path between the two wirings, and that this transistor, or the like, is in an ON state.

Moreover, in the present specification, a certain direction parallel to a surface of a substrate will be called an X direction, a direction parallel to the surface of the substrate and perpendicular to the X direction will be called a Y direction, and a direction perpendicular to the surface of the substrate will be called a Z direction.

Moreover, in the present specification, sometimes, a direction along a certain plane will be called a first direction, a direction intersecting the first direction along this certain plane will be called a second direction, and a direction intersecting this certain plane will be called a third direction. These first direction, second direction, and third direction may, but need not, each respectively correspond to any one of the X direction, the Y direction, and the Z direction.

Moreover, in the present specification, expressions such as "up" or "down" will be defined with reference to the substrate. For example, an orientation of moving away from the substrate along the above-described Z direction will be called up, and an orientation of coming closer to the substrate along the Z direction will be called down. Moreover, when a lower surface or a lower end is referred to for a certain configuration, this will be assumed to mean a surface or end portion on a substrate side of this configuration, and when an upper surface or an upper end is referred to for a certain configuration, this will be assumed to mean a surface or end portion on an opposite side to the substrate of this configuration. Moreover, a surface intersecting the X direction or the Y direction will be called a side surface, and so on.

First Embodiment

[Memory System 10]

FIG. 1 is a schematic block diagram showing a configuration of a memory system 10 according to a first embodiment.

The memory system 10 performs read, write, erase, and so on, of user data, in response to a signal transmitted from a host computer 20. The memory system 10 is a memory chip, a memory card, an SSD, or another system capable of storing user data, for example. The memory system 10 comprises: a plurality of memory dies MD storing user data; and a control die CD connected to these plurality of memory dies MD and the host computer 20. The control die CD comprises the likes of a processor and a RAM, for example, and performs processing, such as conversion of a logical address and a physical address, bit error detection/correction, garbage collection (compaction), and wear leveling.

Figure 2:
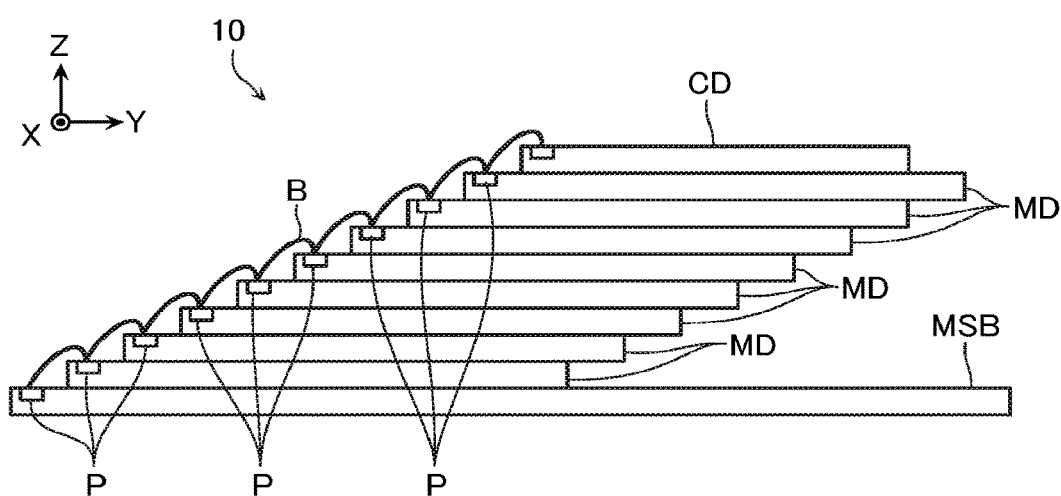
FIG. 2 is a schematic side view showing a configuration example of same memory system 10.
Figure 3:
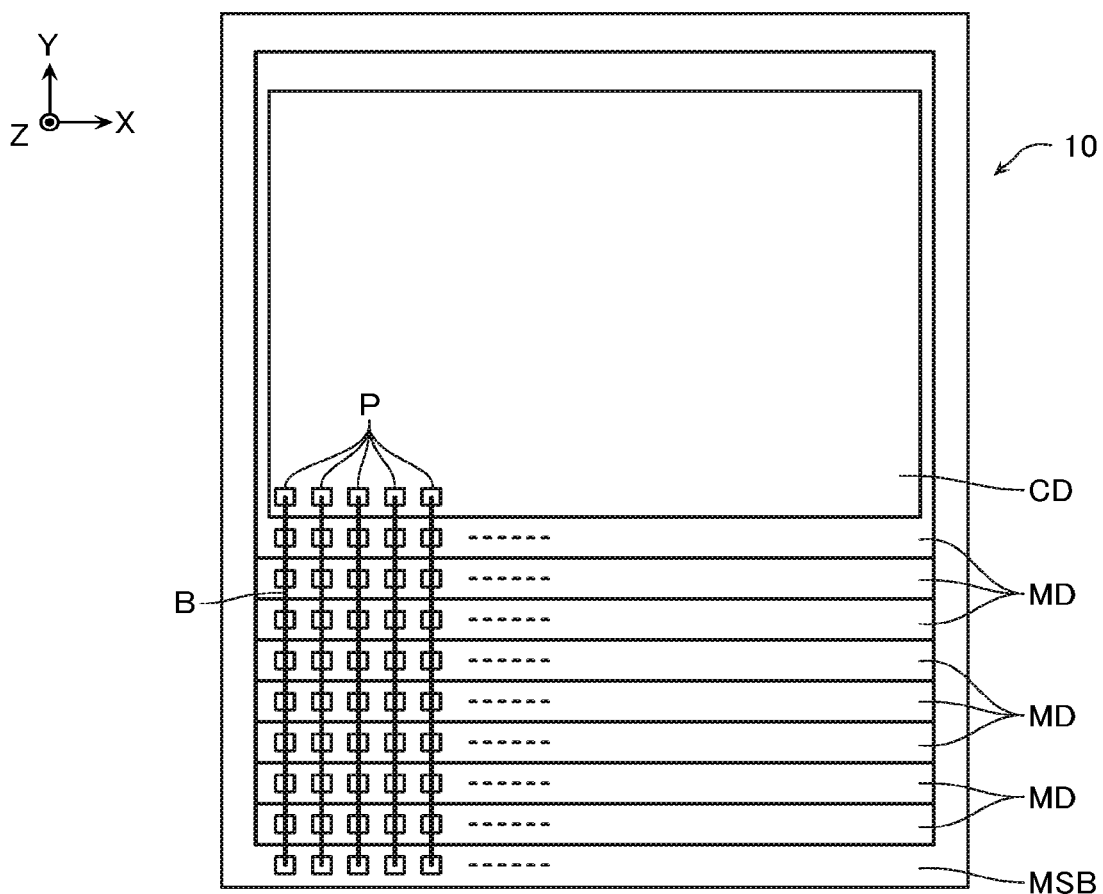
FIG. 3 is a schematic plan view showing same configuration example.

FIG. 2 is a schematic side view showing a configuration example of the memory system 10 according to the present embodiment. FIG. 3 is a schematic plan view showing same configuration example. For convenience of description, some configurations will be omitted in FIGS. 2 and 3.

As shown in FIG. 2, the memory system 10 according to the present embodiment comprises: a mounting substrate MSB; a plurality of the memory dies MD laminated on the mounting substrate MSB; and the control die CD laminated on the memory dies MD. A region of an end portion in the Y direction, of an upper surface of the mounting substrate MSB is provided with a pad electrode P, and some of another region of the upper surface of the mounting substrate MSB is connected to a lower surface of the memory die MD, via an adhesive agent, or the like. A region of an end portion in the Y direction, of an upper surface of the memory die MD is provided with the pad electrode P, and another region of the upper surface of the memory die MD is connected to a lower surface of another memory die MD or the control die CD, via an adhesive agent, or the like. A region of an end portion in the Y direction, of an upper surface of the control die CD is provided with the pad electrode P.

As shown in FIG. 3, the mounting substrate MSB, the plurality of memory dies MD, and the control die CD each comprise a plurality of the pad electrodes P aligned in the X direction. Pluralities of the pad electrodes P provided to the mounting substrate MSB, the plurality of memory dies MD, and the control die CD are respectively connected to each other via bonding wires B.

[Circuit Configuration of Memory Die MD]

Figure 4:
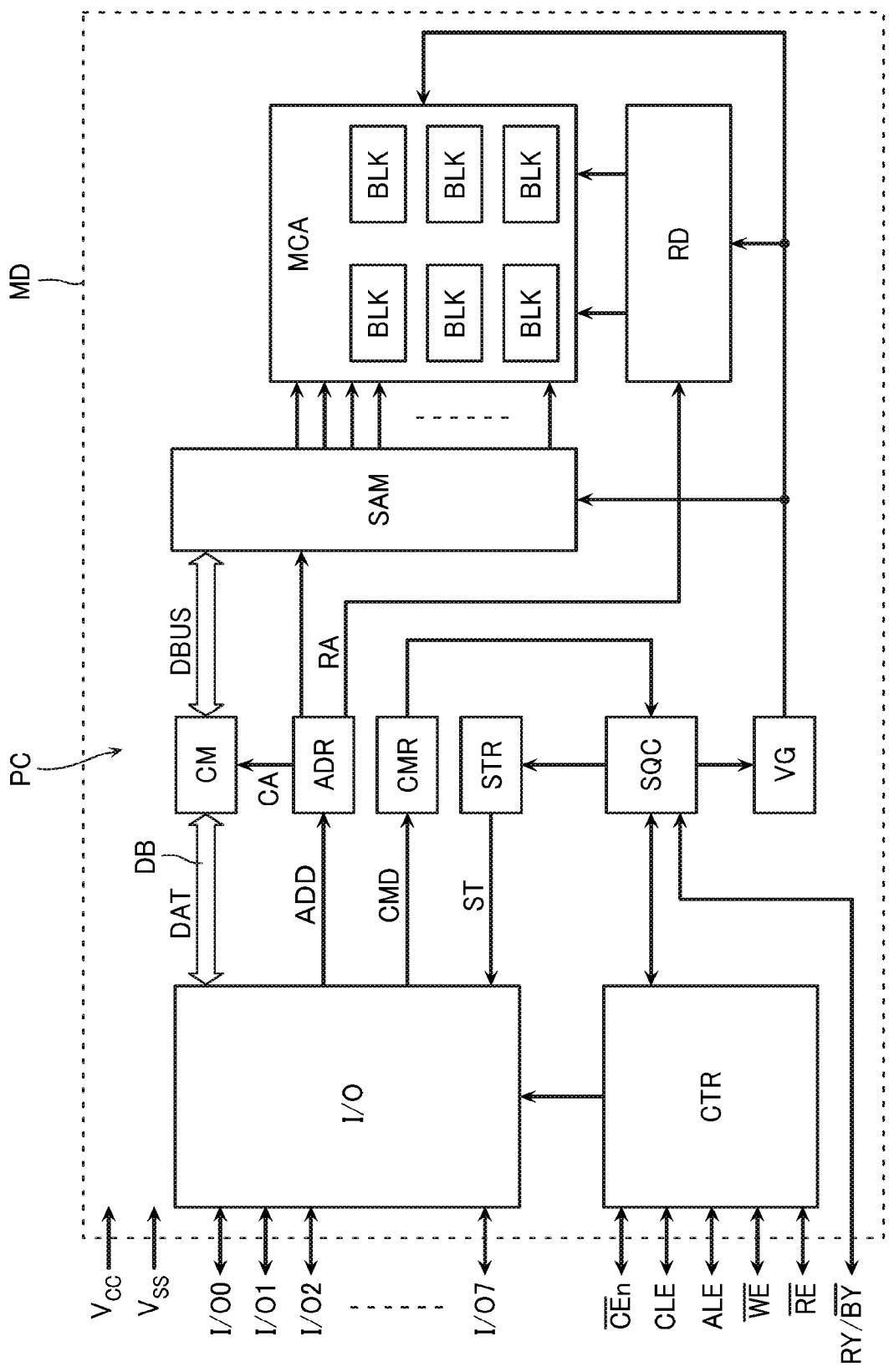
FIG. 4 is a schematic block diagram showing a configuration of a memory die MD according to the first embodiment.

FIG. 4 is a schematic block diagram showing a configuration of the memory die MD according to the first embodiment. FIGS. 5, 6A, 6B, 6C, 7A, and 7B are schematic circuit diagrams showing configurations of parts of the memory die MD.

As shown in FIG. 4, the memory die MD comprises: a memory cell array MCA that stores data; and a peripheral circuit PC connected to the memory cell array MCA. The peripheral circuit PC comprises a voltage generating circuit VG, a row decoder RD, a sense amplifier module SAM, and a sequencer SQC. In addition, the peripheral circuit PC comprises a cache memory CM, an address register ADR, a command register CMR, and a status register STR. In addition, the peripheral circuit PC comprises an input/output control circuit I/O and a logic circuit CTR.

[Memory Cell Array MCA]

Figure 5:
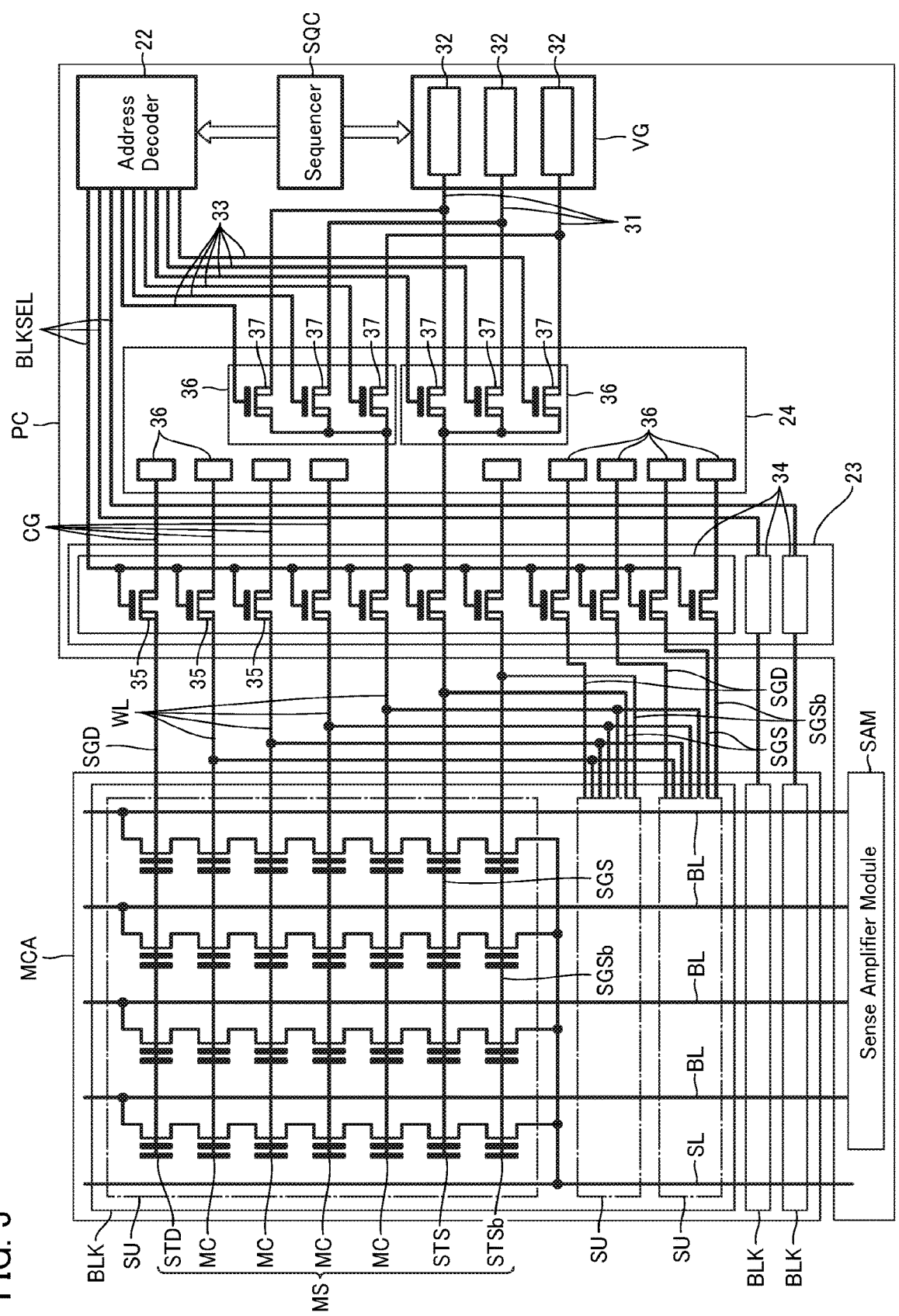
FIG. 5 is a schematic circuit diagram showing a configuration of part of same memory die MD.

The memory cell array MCA comprises a plurality of memory blocks BLK, as shown in FIG. 5. These plurality of memory blocks BLK each comprise a plurality of string units SU. These plurality of string units SU each comprise a plurality of memory strings MS. One ends of these plurality of memory strings MS are respectively connected to the peripheral circuit PC via bit lines BL. Moreover, the other ends of these plurality of memory strings MS are each connected to the peripheral circuit PC via a common source line SL.

The memory string MS comprises a drain side select transistor STD, a plurality of memory cells MC (memory transistors), a source side select transistor STS, and a source side select transistor STSb that are connected in series between the bit line BL and the source line SL. Hereafter, the drain side select transistor STD, the source side select transistor STS, and the source side select transistor STSb will sometimes simply be called select transistors (STD, STS, STSb).

The memory cell MC is a field effect type of transistor that comprises: a semiconductor layer functioning as a channel region; a gate insulating film including a charge accumulating film; and a gate electrode. A threshold voltage of the memory cell MC changes according to an amount of charge in the charge accumulating film. The memory cell MC stores 1 bit or a plurality of bits of data. Note that the gate electrodes of the plurality of memory cells MC corresponding to one memory string MS are respectively connected to word lines WL. These word lines WL are respectively commonly connected to all the memory strings MS in one memory block BLK.

The select transistor (STD, STS, STSb) is a field effect type of transistor that comprises: a semiconductor layer functioning as a channel region; a gate insulating film; and a gate electrode. The gate electrodes of the select transistors (STD, STS, STSb) are respectively connected with select gate lines (SGD, SGS, SGSb). A drain side select gate line SGD is provided correspondingly to the string unit SU and is commonly connected to all the memory strings MS in one string unit SU. A source side select gate line SGS is commonly connected to all the memory strings MS in a plurality of the string units SU. A source side select gate line SGSb is commonly connected to all the memory strings MS in a plurality of the string units SU.

[Voltage Generating Circuit VG]

The voltage generating circuit VG (FIG. 4) is connected to a plurality of voltage supply lines 31, as shown in FIG. 5, for example. The voltage generating circuit VG includes a step-down circuit such as a regulator, and a booster circuit such as a charge pump circuit 32, for example. These step-down circuit and charge pump circuit 32 are each connected to voltage supply lines supplied with a power supply voltage $V_{CC}$ and a ground voltage $V_{SS}$ (FIG. 4). These voltage supply lines are connected to the pad electrodes P described with reference to FIGS. 2 and 3, for example. The voltage generating circuit VG generates and simultaneously outputs to the plurality of voltage supply lines 31 a plurality of types of operation voltages that are applied to the bit lines BL, the source line SL, the word lines WL, and the select gate lines (SGD, SGS, SGSb) during a read operation, a write operation, and an erase operation on the memory cell array MCA, according to a control signal from the sequencer SQC, for example. The operation voltages outputted from the voltage supply lines 31 are appropriately adjusted according to the control signal from the sequencer SQC.

Figure 6A:
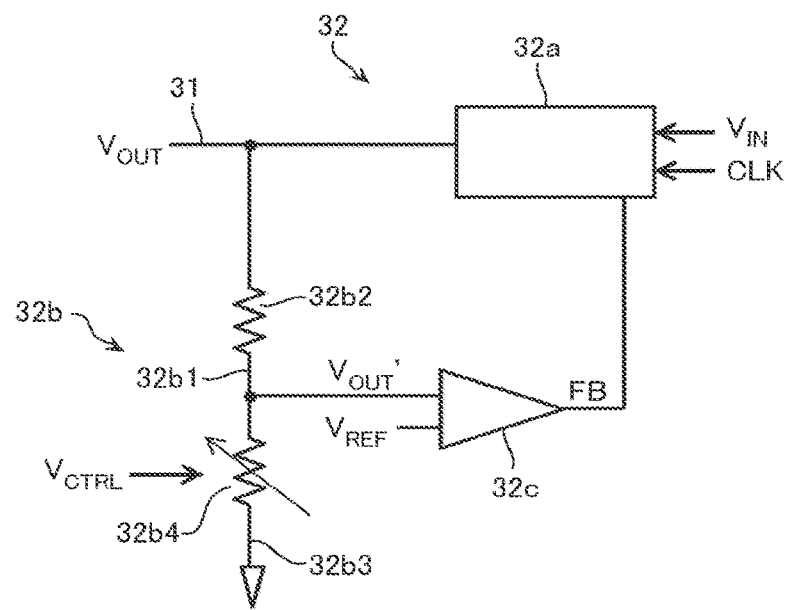
FIG. 6A is a schematic circuit diagram showing a configuration of part of same memory die MD.

As shown in FIG. 6A, for example, the charge pump circuit 32 comprises: a voltage output circuit 32$a$ that outputs a voltage $V_{OUT}$ to the voltage supply line 31; a voltage dividing circuit 32$b$ connected to the voltage supply line 31; and a comparator 32$c$ that outputs a feedback signal FB to the voltage output circuit 32$a$ depending on a magnitude relationship of a voltage $V_{OUT}'$ outputted from the voltage dividing circuit 32$b$ and a reference voltage $V_{REF}$.

Figure 6B:
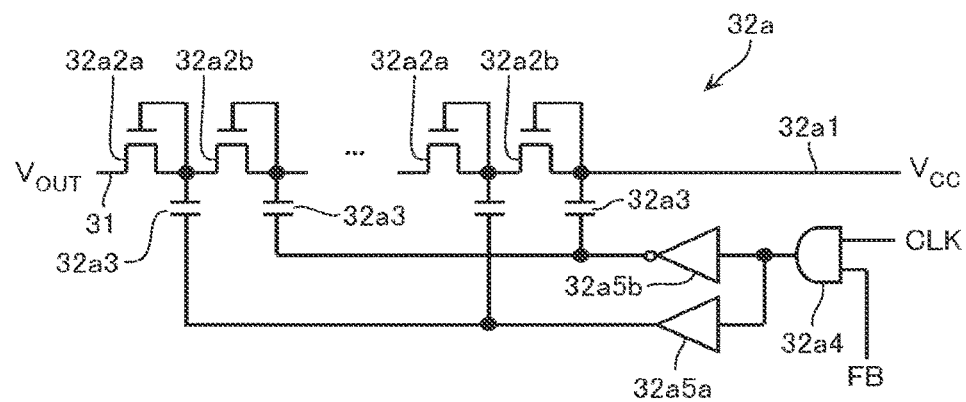
FIG. 6B is a schematic circuit diagram showing a configuration of part of same memory die MD.

The voltage output circuit 32$a$ comprises a plurality of transistors 32$a$2$a$, 32$a$2$b$ connected to each other between the voltage supply line 31 and a voltage supply line 32$a$1, as shown in FIG. 6B. The voltage supply line 32$a$1 is supplied with the power supply voltage $V_{CC}$. Gate electrodes of the serially connected plurality of transistors 32$a$2$a$, 32$a$2$b$ are connected to their respective drain electrodes and capacitors 32$a$3. Moreover, the voltage output circuit 32$a$ comprises: an AND circuit 32$a$4 that outputs a logical sum of a clock signal CLK and the feedback signal FB; a level shifter 32$a$5$a$ that outputs in a boosted state an output signal of the AND circuit 32$a$4; and a level shifter 32$a$5$b$ that outputs in a boosted state an inverted signal of the output signal of the AND circuit 32$a$4. An output signal of the level shifter 32$a$5$a$ is connected to the gate electrode of the transistor 32$a$2$a$ via the capacitor 32$a$3. An output signal of the level shifter 32$a$5$b$ is connected to the gate electrode of the transistor 32$a$2$b$ via the capacitor 32$a$3.

When the feedback signal FB is in an "H" state, the clock signal CLK is outputted from the AND circuit 32$a$4. As a result, electrons are transported to the voltage supply line 32$a$1 from the voltage supply line 31, and a voltage of the voltage supply line 31 increases. On the other hand, when the feedback signal FB is in an "L" state, the clock signal CLK is not outputted from the AND circuit 32$a$4. Hence, the voltage of the voltage supply line 31 does not increase.

As shown in FIG. 6A, the voltage dividing circuit 32$b$ comprises: a resistance element 32$b$2 connected between the voltage supply line 31 and a voltage dividing terminal 32$b$1; and a variable resistance element 32$b$4 serially connected between the voltage dividing terminal 32$b$1 and a voltage supply line 32$b$3. The voltage supply line 32$b$3 is supplied with the ground voltage $V_{SS}$. A resistance value of the variable resistance element 32$b$4 is adjustable depending on an operation voltage control signal $V_{CTRL}$. Hence, magnitude of the voltage $V_{OUT}'$ of the voltage dividing terminal 32$b$1 is adjustable depending on the operation voltage control signal $V_{CTRL}$.

Figure 6C:
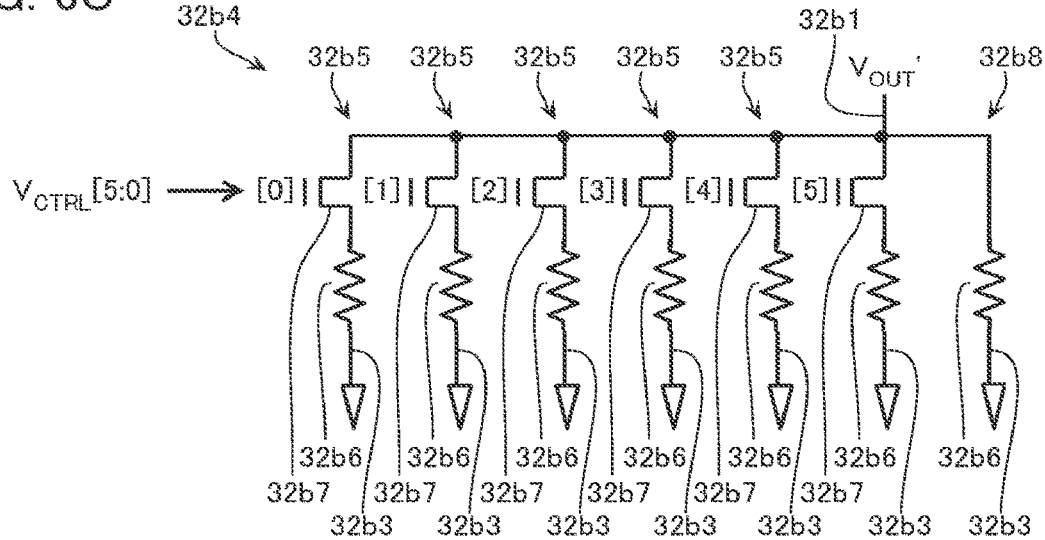
FIG. 6C is a schematic circuit diagram showing a configuration of part of same memory die MD.

As shown in FIG. 6C, the variable resistance element 32$b$4 comprises a plurality of current paths 32$b$5 connected in parallel between the voltage dividing terminal 32$b$1 and the voltage supply line 32$b$3. These plurality of current paths 32$b$5 each comprise a resistance element 32$b$6 and a transistor 32$b$7 that are serially connected. Resistance values of the resistance elements 32$b$6 provided to each of the current paths 32$b$5 may have magnitudes that differ from each other. Gate electrodes of the transistors 32$b$7 provided to each of the current paths 32$b$5 are respectively inputted with different bits of the operation voltage control signal $V_{CTRL}$. Moreover, the variable resistance element 32$b$4 may have a current path 32$b$8 that does not include the transistor 32$b$7.

The comparator 32$c$ outputs the feedback signal FB, as shown in FIG. 6A. The feedback signal FB attains an "L" state when, for example, the voltage $V_{OUT}'$ of the voltage dividing terminal 32b1 is larger than the reference voltage $V_{REF}$. Moreover, the feedback signal FB attains an "H" state when, for example, the voltage $V_{OUT}'$ is smaller than the reference voltage $V_{REF}$.

[Row Decoder RD]

As shown in FIG. 5, for example, the row decoder RD (FIG. 4) comprises: an address decoder 22 that decodes address data ADD; and a block select circuit 23 and voltage select circuit 24 that transfer an operation voltage to the memory cell array MCA in response to an output signal of the address decoder 22.

The address decoder 22 comprises a plurality of block select lines BLKSEL and a plurality of voltage select lines 33. The address decoder 22 sequentially refers to a row address RA of the address register ADR (FIG. 4) in accordance with a control signal from the sequencer SQC, and decodes this row address RA to set to an ON state a certain block select transistor 35 and voltage select transistor 37 corresponding to the row address RA, and set to an OFF state the other block select transistors 35 and the other voltage select transistors 37, for example. For example, voltages of a certain block select line BLKSEL and voltage select line 33 are set to an "H" state, and voltages of the other block select lines BLKSEL and voltage select lines 33 are set to an "L" state. Note that when transistors of P channel type and not N channel type are employed, these wirings are applied with reverse voltages.

Note that in the illustrated example, the block select lines BLKSEL are provided one each for each one of the memory blocks BLK, in the address decoder 22. However, this configuration may be appropriately changed. For example, the block select lines BLKSEL may be provided one each for every two or more of the memory blocks BLK.

The block select circuit 23 comprises a plurality of block select sections 34 corresponding to the memory blocks BLK. These plurality of block select sections 34 each comprise a plurality of the block select transistors 35 corresponding to the word lines WL and the select gate lines (SGD, SGS, SGSb). The block select transistor 35 is for example a field effect type of voltage-withstanding transistor. Drain electrodes of the block select transistors 35 are each electrically connected to a corresponding one of the word lines WL or select gate lines (SGD, SGS, SGSb). Source electrodes of the block select transistors 35 are each electrically connected to one of the voltage supply lines 31 via a wiring CG and the voltage select circuit 24. Gate electrodes of the block select transistors 35 are commonly connected to a corresponding one of the block select lines BLKSEL.

Note that the block select circuit 23 further comprises an unillustrated plurality of transistors. These plurality of transistors are field effect type of voltage-withstanding transistors that are connected between the select gate lines (SGD, SGS, SGSb) and a voltage supply line supplied with the ground voltage $V_{SS}$. These plurality of transistors supply the ground voltage $V_{SS}$ to the select gate lines (SGD, SGS, SGSb) included in an unselected memory block BLK. Note that the plurality of word lines WL included in the unselected memory block BLK are in a floating state.

The voltage select circuit 24 comprises a plurality of voltage select sections 36 corresponding to the word lines WL and the select gate lines (SGD, SGS, SGSb). These plurality of voltage select sections 36 each comprise a plurality of the voltage select transistors 37. The voltage select transistor 37 is for example a field effect type of voltage-withstanding transistor. Drain terminals of the voltage select transistors 37 are each electrically connected to a corresponding one of the word lines WL or select gate lines (SGD, SGS, SGSb) via one of the wirings CG and the block select circuit 23. Source terminals of the voltage select transistors 37 are each electrically connected to a corresponding one of the voltage supply lines 31. Gate electrodes of the voltage select transistors 37 are each connected to a corresponding one of the voltage select lines 33.

[Sense Amplifier Module SAM]

Figure 7A:
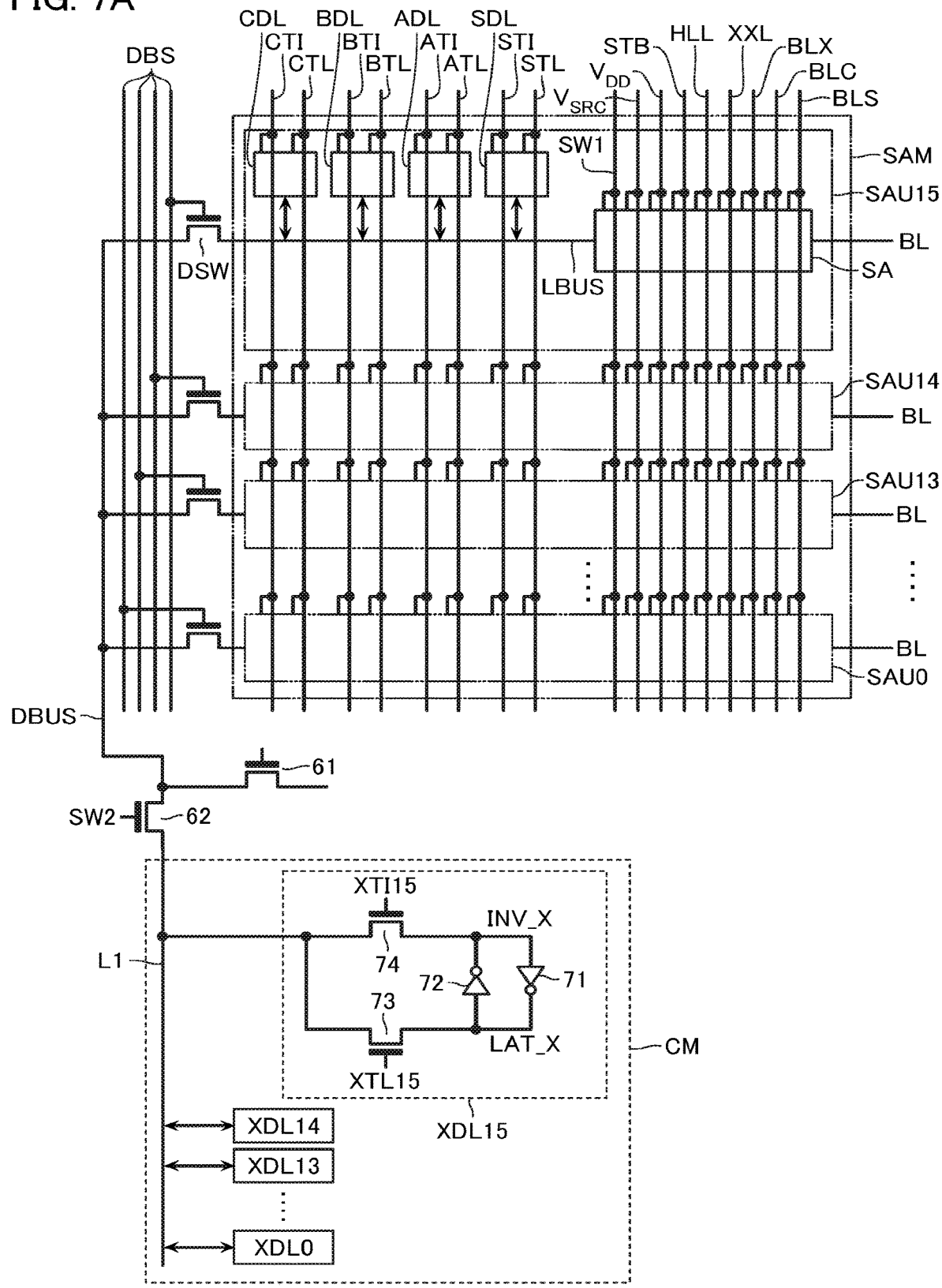
FIG. 7A is a schematic circuit diagram showing a configuration of part of same memory die MD.

As shown in FIG. 7A, for example, the sense amplifier module SAM (FIG. 4) comprises a plurality of sense amplifier units SAU0-SAU15 corresponding to a plurality of the bit lines BL. The sense amplifier units SAU0-SAU15 each comprise: a sense amplifier SA connected to the bit line BL; a wiring LBUS connected to the sense amplifier SA; latch circuits SDL, ADL, BDL, CDL connected to the wiring LBUS; and a charge transistor 55 for pre-charge (FIG. 7B), connected to the wiring LBUS. The wirings LBUS in the sense amplifier units SAU0-SAU15 are connected to wirings DBUS via switch transistors DSW. Note that the wirings DBUS are connected with charge transistors 61 for pre-charge.

Figure 7B:
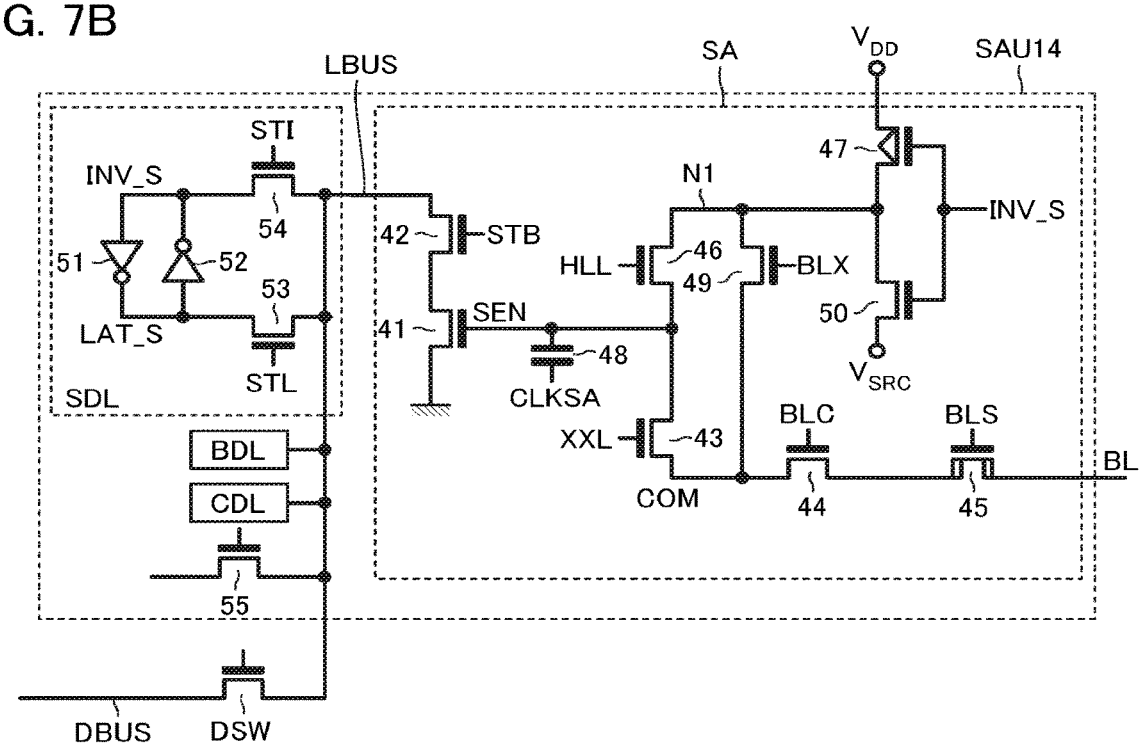
FIG. 7B is a schematic circuit diagram showing a configuration of part of same memory die MD.

As shown in FIG. 7B, the sense amplifier SA comprises a sense transistor 41 that discharges a charge of the wiring LBUS depending on a current flowing in the bit line BL. A source electrode of the sense transistor 41 is connected to a voltage supply line supplied with the ground voltage $V_{SS}$. A drain electrode of the sense transistor 41 is connected to the wiring LBUS via a switch transistor 42. A gate electrode of the sense transistor 41 is connected to the bit line BL via a sense node SEN, a discharge transistor 43, a node COM, a clamp transistor 44, and a voltage-withstanding transistor 45. Note that the sense node SEN is connected to an internal control signal line CLKSA via a capacitor 48.

Moreover, the sense amplifier SA comprises a voltage transfer circuit that selectively causes the node COM and the sense node SEN to be electrically continuous with a voltage supply line supplied with a voltage $V_{DD}$ or a voltage supply line supplied with a voltage $V_{SRC}$, depending on data latched in the latch circuit SDL. This voltage transfer circuit comprises: a node N1; a charge transistor 46 connected between the node N1 and the sense node SEN; a charge transistor 49 connected between the node N1 and the node COM; a charge transistor 47 connected between the node N1 and the voltage supply line supplied with the voltage $V_{DD}$; and a discharge transistor 50 connected between the node N1 and the voltage supply line supplied with the voltage $V_{SRC}$. Note that gate electrodes of the charge transistor 47 and the discharge transistor 50 are commonly connected to a node INV_S of the latch circuit SDL.

Note that the sense transistor 41, the switch transistor 42, the discharge transistor 43, the clamp transistor 44, the charge transistor 46, the charge transistor 49, and the discharge transistor 50 are, for example, enhancement type NMOS transistors. The voltage-withstanding transistor 45 is, for example, a depression type NMOS transistor. The charge transistor 47 is, for example, a PMOS transistor.

Moreover, a gate electrode of the switch transistor 42 is connected to a signal line STB. A gate electrode of the discharge transistor 43 is connected to a signal line XXL. A gate electrode of the clamp transistor 44 is connected to a signal line BLC. A gate electrode of the voltage-withstanding transistor 45 is connected to a signal line BLS. A gate electrode of the charge transistor 46 is connected to a signal line HLL. A gate electrode of the charge transistor 49 is connected to a signal line BLX. These signal lines STB, XXL, BLC, BLS, HLL, BLX are connected to the sequencer SQC.

The latch circuit SDL comprises: a node LAT_S and the node INV_S; an inverter 51 comprising an output terminal connected to the node LAT_S and an input terminal connected to the node INV_S; an inverter 52 comprising an input terminal connected to the node LAT_S and an output terminal connected to the node INV_S; a switch transistor 53 connected to the node LAT_S and the wiring LBUS; and a switch transistor 54 connected to the node INV_S and the wiring LBUS. The switch transistors 53, 54 are, for example, NMOS transistors. A gate electrode of the switch transistor 53 is connected to the sequencer SQC via a signal line STL. A gate electrode of the switch transistor 54 is connected to the sequencer SQC via a signal line STI.

The latch circuits ADL, BDL, CDL are configured substantially similarly to the latch circuit SDL. However, as mentioned above, the node INV_S of the latch circuit SDL is electrically continuous with the gate electrodes of the charge transistor 47 and the discharge transistor 50 in the sense amplifier SA. The latch circuits ADL, BDL, CDL differ from the latch circuit SDL in this respect.

The switch transistor DSW is, for example, an NMOS transistor. The switch transistor DSW is connected between the wiring LBUS and the wiring DBUS. A gate electrode of the switch transistor DSW is connected to the sequencer SQC via a signal line DBS (FIG. 7A).

Note that as shown in FIG. 7A, the above-mentioned signal lines SIB, HLL, XXL, BLX, BLC, BLS are each commonly connected to all the sense amplifier units SAU included in the sense amplifier module SAM. Moreover, the above-mentioned voltage supply lines supplied with the voltage $V_{DD}$ and voltage supply line supplied with the voltage $V_{SRC}$ are each commonly connected to all the sense amplifier units SAU included in the sense amplifier module SAM. Moreover, the signal line STI and the signal line STL of the latch circuit SDL are each commonly connected to all the sense amplifier units SAU included in the sense amplifier module SAM. Similarly, signal lines ATI, ATL, BTI, BTL, CTI, CTL corresponding to the signal line STI and the signal line STL in the latch circuits ADL, BDL, CDL are each commonly connected to all the sense amplifier units SAU included in the sense amplifier module SAM. On the other hand, a plurality of the above-mentioned signal lines DBS are respectively provided, in a one-to-one corresponding manner, to all the sense amplifier units SAU included in the sense amplifier module SAM.

[Cache Memory CM]

As shown in FIG. 7A, for example, the cache memory CM (FIG. 4) comprises: a wiring L1 connected to the wiring DBUS; and latch circuits XDL0-XDL15 connected to the wiring L1. Data included in the latch circuits XDL0-XDL15 is sequentially transferred to the sense amplifier module SAM or the input/output control circuit I/O, via the wiring L1.

The wiring L1 is connected to the wiring DBUS via a switch transistor 62. A gate electrode of the switch transistor 62 is connected to the sequencer SQC via a signal line SW2.

The latch circuits XDL0-XDL15 each comprise: anode LAT_X and a node INV_X; an inverter 71 comprising an output terminal connected to the node LAT_X and an input terminal connected to the node INV_X; an inverter 72 comprising an input terminal connected to the node LAT_X and an output terminal connected to the node INV_X; a switch transistor 73 connected to the node LAT_X and the wiring L1; and a switch transistor 74 connected to the node INV_X and the wiring L1. The switch transistors 73, 74 are, for example, NMOS transistors. A gate electrode of the switch transistor 73 is connected to the sequencer SQC via a corresponding one of signal lines XTL0-XTL15. A gate electrode of the switch transistor 74 is connected to the sequencer SQC via a corresponding one of signal lines XTI0-XTI15.

Moreover, the cache memory CM is connected with an unillustrated decode circuit and unillustrated switch circuit. The decode circuit decodes a column address CA held in the address register ADR (FIG. 4). The switch circuit causes a latch circuit corresponding to the column address CA to be electrically continuous with a bus DB (FIG. 4), depending on an output signal of the decode circuit.

[Sequencer SQC]

The sequencer SQC (FIG. 4) sequentially decodes command data CMD held in the command register CMR, and outputs internal control signals to the row decoder RD, the sense amplifier module SAM, and the voltage generating circuit VG. In addition, the sequencer SQC appropriately outputs to the status register STR status data indicating a state of the sequencer SQC itself. Moreover, the sequencer SQC generates a ready/busy signal, and outputs the ready/busy signal to a terminal RY//BY. Note that the terminal RY//BY is realized by the pad electrode P described with reference to FIGS. 2 and 3, for example.

[Input/Output Control Circuit I/O]

The input/output control circuit I/O (FIG. 4) comprises: data input/output terminals I/O0-I/O7; and an input circuit such as a comparator and output circuit such as an OCD circuit that are connected to these data input/output terminals I/O0-I/O7. In addition, the input/output control circuit I/O comprises: a shift register and a buffer circuit connected to these input circuit and output circuit. The data input/output terminals I/O0-I/O7 are realized by the pad electrode P described with reference to FIGS. 2 and 3, for example. Data inputted via the data input/output terminals I/O0-I/O7 is outputted to the cache memory CM, the address register ADR, or the command register CMR from the buffer circuit, in response to an internal control signal from the logic circuit CTR. Moreover, data outputted via the data input/output terminals I/O0-I/O7 is inputted to the buffer circuit from the cache memory CM or the status register STR, in response to an internal control signal from the logic circuit CTR.

[Logic Circuit CTR]

The logic circuit CTR (FIG. 4) receives an external control signal from the control die CD via external control terminals /CEn, CLE, ALE, /WE, /RE, and outputs an internal control signal to the input/output control circuit I/O depending on this external control signal. Note that the external control terminals /CEn, CLE, ALE, /WE, /RE are realized by the pad electrode P described with reference to FIGS. 2 and 3, for example.

The external control terminal /CEn is employed at a time of selecting the memory die MD. The input/output control circuit I/O of a memory die MD whose external control terminal /CEn is inputted with "L" performs input/output of data via the data input/output terminals I/O0-I/O7. The input/output control circuit I/O of a memory die MD whose external control terminal /CEn is inputted with "H" does not perform input/output of data via the data input/output terminals I/O0-I/O7.

Moreover, the external control terminal CLE is employed at a time of using the command register CMR. When the external control terminal CLE is inputted with "H", data that has been inputted via the data input/output terminals I/O0-I/O7 is stored in a buffer memory in the input/output control circuit I/O as the command data CMD, and transferred to the command register CMR.

Moreover, the external control terminal ALE is employed at a time of using the address register ADR. When the external control terminal ALE is inputted with "H", data that has been inputted via the data input/output terminals I/O0-I/O7 is stored in a buffer memory in the input/output control circuit I/O as address data ADD, and transferred to the address register ADR.

Note that when both of the external control terminals CLE, ALE are inputted with "L", data that has been inputted via the data input/output terminals I/O0-I/O7 is stored in a buffer memory in the input/output control circuit I/O as user data DAT, and transferred to the cache memory CM via the bus DB.

Moreover, the external control terminal /WE is employed when inputting data via the data input/output terminals I/O0-I/O7. Data that has been inputted via the data input/output terminals I/O0-I/O7 is captured in a shift register in the input/output control circuit I/O at a timing of rise of voltage (switching of input signal) of the external control terminal /WE.

Moreover, the external control terminal /RE is employed when outputting data via the data input/output terminals I/O0-I/O7. Data outputted from the data input/output terminals I/O0-I/O7 is switched at a timing of rise of voltage (switching of input signal) of the external control terminal /RE.

[Structure of Memory Die MD]

Figure 8:
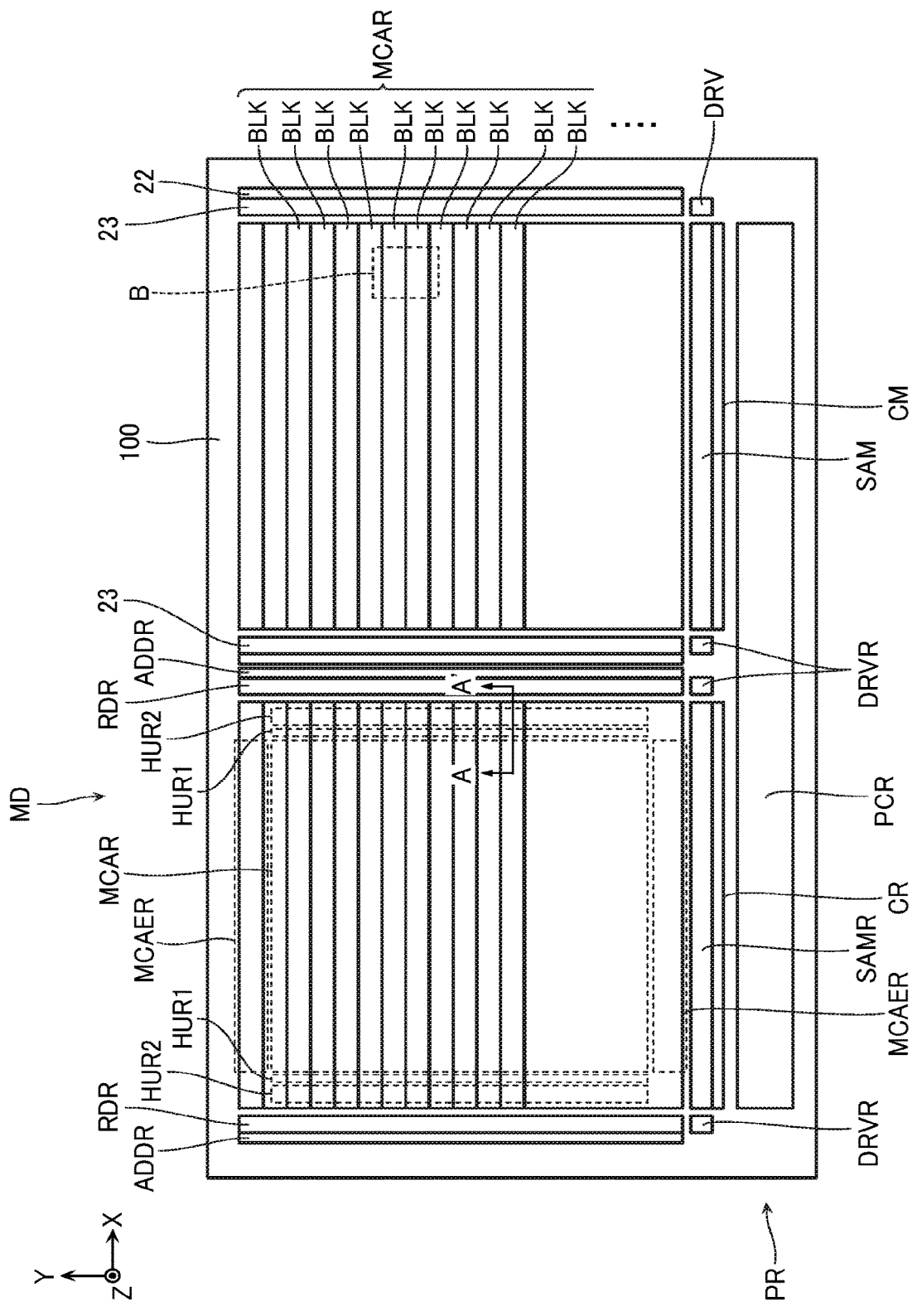
FIG. 8 is a schematic plan view of same memory die MD.
Figure 9:
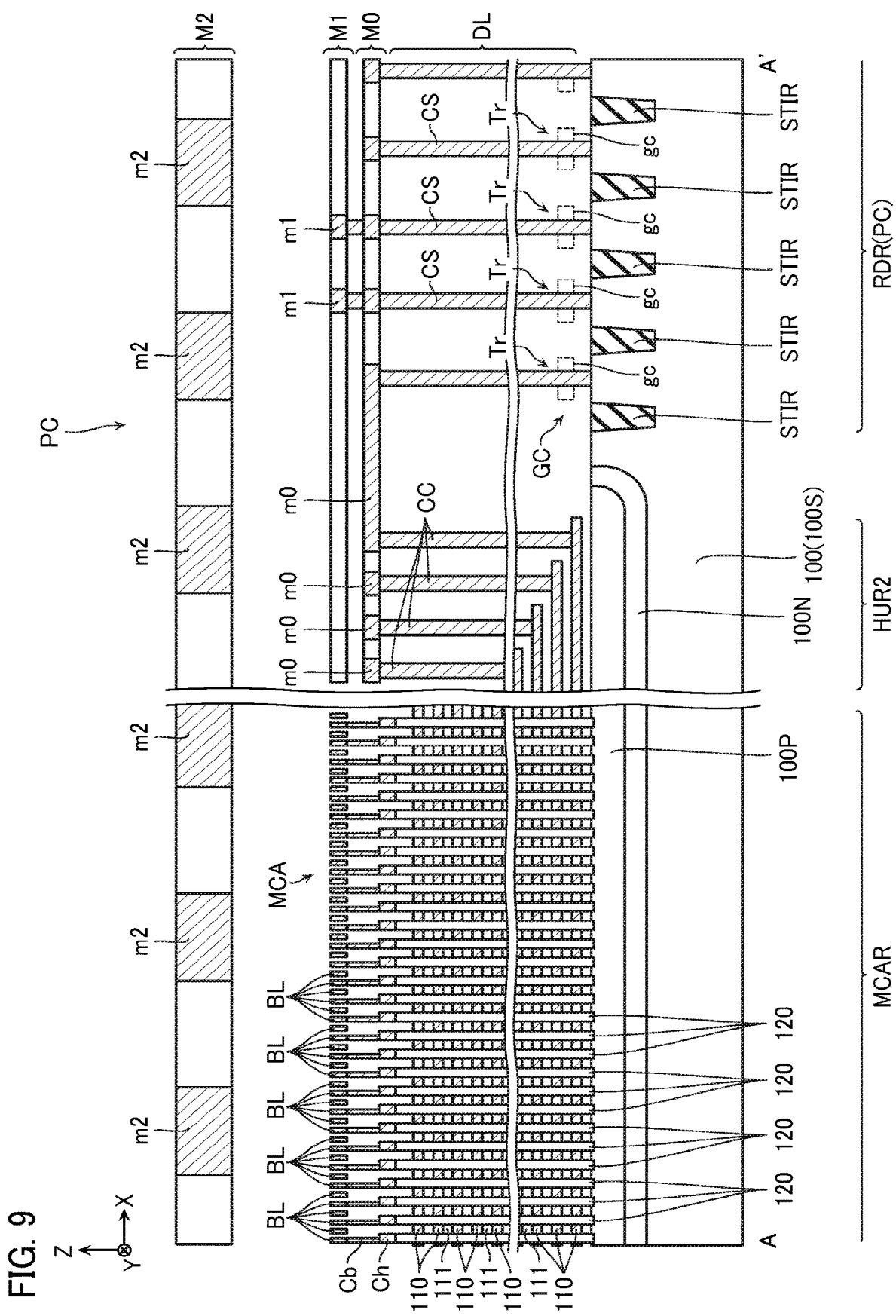
FIG. 9 is a schematic cross-sectional view in which the structure shown in FIG. 8 is sectioned along the line A-A' and looked at in the direction of the arrows.
Figure 10A:
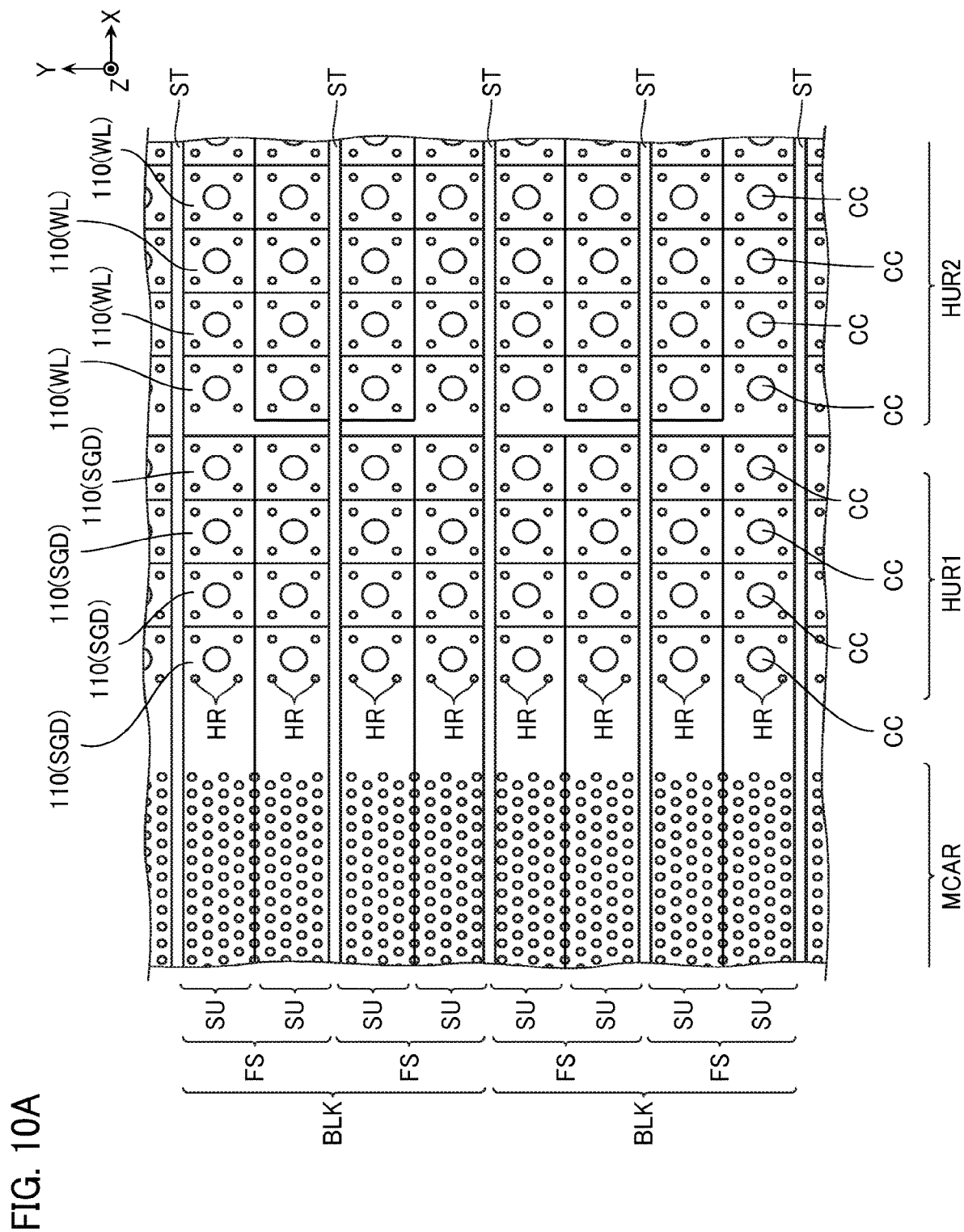
FIG. 10A is a schematic enlarged view of the portion indicated by B of FIG. 8.
Figure 11:
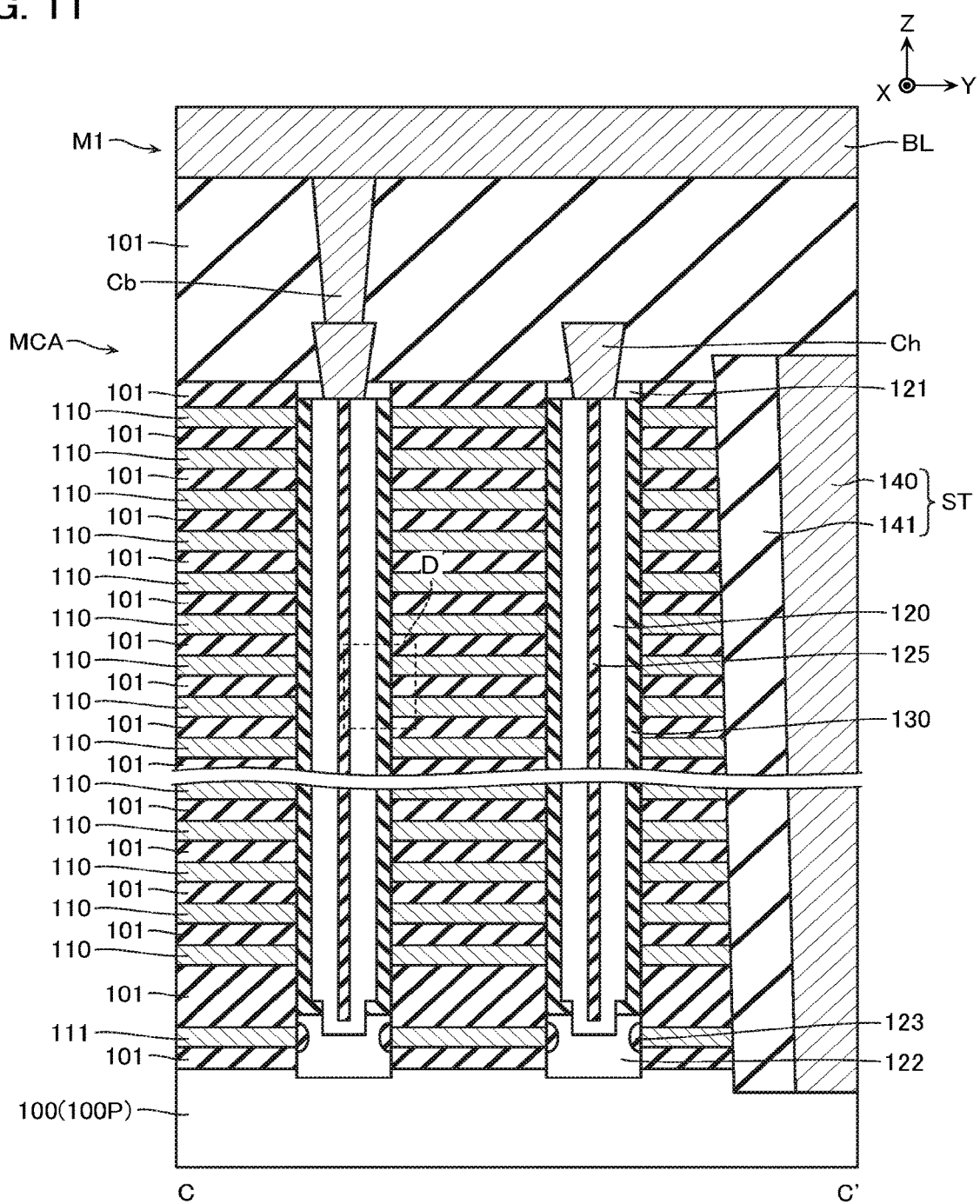
FIG. 11 is a schematic cross-sectional view in which the structure shown in FIG. 10B is sectioned along the line C-C' and looked at in the direction of the arrows.
Figure 12:
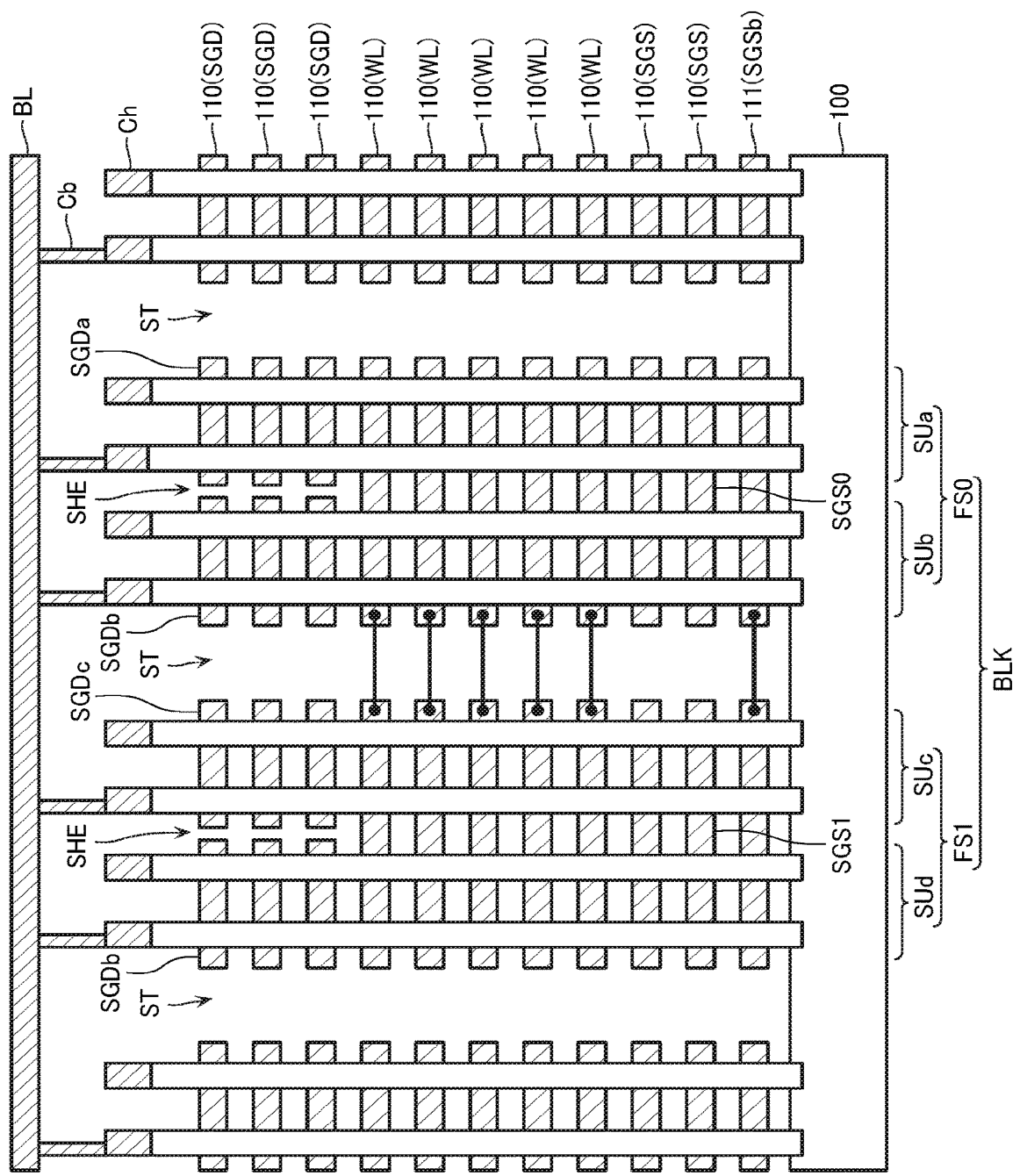
FIG. 12 is a schematic cross-sectional view of the memory die MD.
Figure 13:
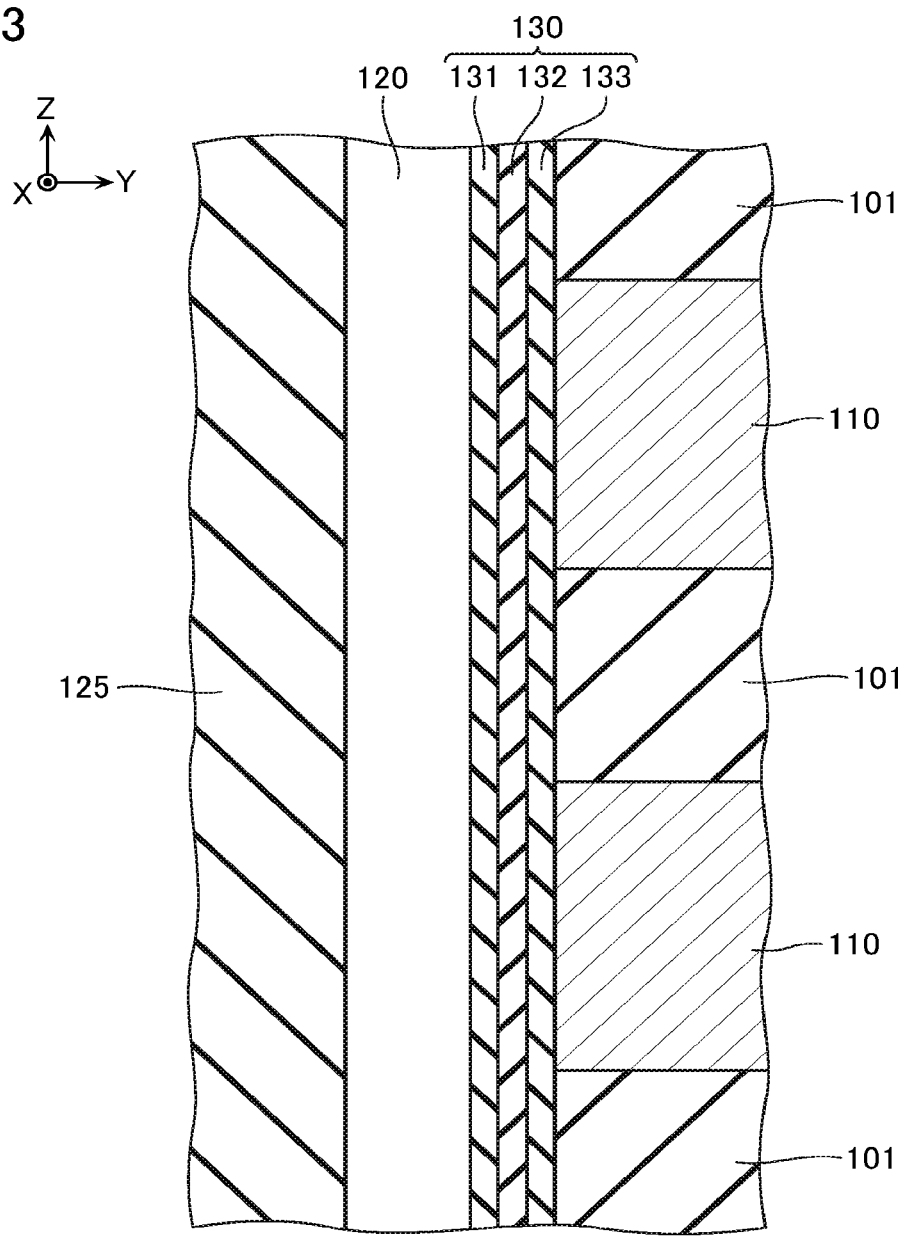
FIG. 13 is a schematic enlarged view of the portion indicated by D of FIG. 11.

FIG. 8 is a schematic plan view of the memory die MD. FIG. 9 is a schematic cross-sectional view in which the structure shown in FIG. 8 is sectioned along the line A-A' and looked at in the direction of the arrows. FIG. 10A is a schematic enlarged view of the portion indicated by B of FIG. 8. FIG. 10B is a schematic enlarged view of each of regions shown in FIG. 10A. FIG. 11 is a schematic cross-sectional view in which the structure shown in FIG. 10B is sectioned along the line C-C' and looked at in the direction of the arrows. FIG. 12 is a schematic cross-sectional view of the memory die MD. FIG. 13 is a schematic enlarged view of the portion indicated by D of FIG. 11.

As shown in FIG. 8, the memory die MD comprises a semiconductor substrate 100. In the example illustrated, the semiconductor substrate 100 is provided with two memory cell array regions MCAR that are aligned in the X direction. At positions aligned in the X direction with the memory cell array region MCAR, there are provided: a first hookup region HUR1; a second hookup region HUR2 which is further from the memory cell array region MCAR than this first hookup region HUR1 is; a row decoder region RDR which is further from the memory cell array region MCAR than this second hookup region HUR2 is; and an address decoder region ADDR which is further from the memory cell array region MCAR than this row decoder region RDR is. These regions extend in the Y direction along an end portion in the X direction of the memory cell array region MCAR. Moreover, at positions aligned in the Y direction with the memory cell array region MCAR, there are provided: an array end region MCAER; a sense amplifier module region SAMR which is further from the memory cell array region MCAR than this array end region MCAER is; and a cache memory region CR which is further from the memory cell array region MCAR than this sense amplifier module region SAMR is. These regions extend in the X direction along an end portion in the Y direction of the memory cell array region MCAR. Moreover, at a position adjacent in the Y direction to the row decoder region RDR and adjacent in the X direction to the sense amplifier module region SAMR, there is provided a driver region DRVR.

Moreover, in an end portion in the Y direction of the semiconductor substrate 100, there is provided a peripheral circuit region PCR that extends in the X direction. Note that in the description below, the row decoder region RDR, the address decoder region ADDR, the sense amplifier module region SAMR, the cache memory region CR, the driver region DRVR, and the peripheral circuit region PCR will sometimes be called a "peripheral region PR".

Moreover, as shown in FIG. 9, the memory die MD comprises: a device layer DL provided on the semiconductor substrate 100; a wiring layer M0 provided above the device layer DL; a wiring layer M1 provided above the wiring layer M0; and a wiring layer M2 provided above the wiring layer M1.

[Structure of Semiconductor Substrate 100]

The semiconductor substrate 100 is a semiconductor substrate configured from P type silicon (Si) including a P type impurity such as boron (B), for example. As shown in FIG. 9, for example, a surface of the semiconductor substrate 100 is provided with, for example: an N type well region 100N including an N type impurity such as phosphorus (P); a P type well region 100P including a P type impurity such as boron (B); a semiconductor substrate region 100S where the N type well region 100N and the P type well region 100P are not provided; and an insulating region STIR. The N type well region 100N, the P type well region 100P, and the semiconductor substrate region 100S each function as part of a plurality of transistors Tr and a plurality of capacitors, and so on, configuring the peripheral circuit PC.

[Structure in Memory Cell Array Region MCAR of Device Layer DL]

The memory cell array region MCAR is provided with a plurality of the memory blocks BLK aligned in the Y direction, as shown in FIG. 8, for example. The memory block BLK comprises two finger structures FS aligned in the Y direction, as shown in FIG. 10A, for example. An inter-finger-structure structure ST is provided between the two finger structures FS adjacent in the Y direction.

As shown in FIG. 11, for example, the finger structure FS comprises: a plurality of conductive layers 110 aligned in the Z direction; a plurality of semiconductor layers 120 extending in the Z direction; and a plurality of gate insulating films 130 respectively provided between the plurality of conductive layers 110 and the plurality of semiconductor layers 120.

The conductive layer 110 is a substantially plate-like conductive layer extending in the X direction. The conductive layer 110 may include a laminated film of a barrier conductive film of the likes of titanium nitride (TiN) and a metal film of the likes of tungsten (W), or the like. Moreover, the conductive layer 110 may include the likes of polycrystalline silicon including an impurity such as phosphorus (P) or boron (B), for example. An insulating layer 101 of the likes of silicon oxide (SiO$_2$) is provided between the plurality of conductive layers 110 aligned in the Z direction.

A conductive layer 111 is provided below the conductive layer 110. The conductive layer 111 may include, for example, a laminated film of a barrier conductive film of the likes of titanium nitride (TiN) and a metal film of the likes of tungsten (W), or the like. Moreover, the insulating layer 101 of the likes of silicon oxide (SiO$_2$) is provided between the conductive layer 111 and the conductive layer 110.

As shown in FIG. 12, for example, the conductive layer 111 functions as the source side select gate line SGSb (FIG. 5) and as the gate electrodes of the plurality of source side select transistors STSb connected to this source side select gate line SGSb. The conductive layer 111 is electrically independent every memory block BLK.

One or a plurality of the conductive layers 110 positioned in a lowermost layer, of the plurality of conductive layers 110 function as the source side select gate line SGS (FIG. 5) and as the gate electrodes of the plurality of source side select transistors STS connected to this source side select gate line SGS. These plurality of conductive layers 110 are electrically independent every finger structure FS.

Moreover, the plurality of conductive layers 110 positioned more upwardly than these lowermost layer-positioned conductive layers 110 function as the word lines WL (FIG. 5) and as the gate electrodes of the pluralities of memory cells MC (FIG. 5) connected to these word lines WL. These plurality of conductive layers 110 are respectively electrically connected to the plurality of conductive layers 110 adjacent in the X direction. Moreover, these plurality of conductive layers 110 are each electrically independent every memory block BLK.

Moreover, one or a plurality of the conductive layers 110 positioned more upwardly than these word line WL-functioning conductive layers 110 function as the drain side select gate line SGD and as the gate electrodes of the plurality of drain side select transistors STD (FIG. 5) connected to this drain side select gate line SGD. A width in the Y direction of these plurality of conductive layers 110 is smaller than that of the other conductive layers 110. Moreover, as shown in FIGS. 10B and 12, for example, an inter-string-unit structure SHE is provided between two of the conductive layers 110 adjacent in the Y direction. These plurality of conductive layers 110 are each electrically independent every string unit SU.

The semiconductor layers 120 are aligned in a certain pattern in the X direction and the Y direction, as shown in FIG. 10B, for example. The semiconductor layer 120 functions as the channel regions of the plurality of memory cells MC and the select transistors (STD, STS) included in one memory string MS (FIG. 1). The semiconductor layer 120 is a semiconductor layer of the likes of polycrystalline silicon (Si), for example. As shown in FIG. 11, for example, the semiconductor layer 120 has a substantially bottomed cylindrical shape, and has its central portion provided with an insulating layer 125 of the likes of silicon oxide. Moreover, an outer circumferential surface of the semiconductor layer 120 is surrounded by respective ones of the conductive layers 110, and faces the conductive layers 110.

An upper end portion of the semiconductor layer 120 is provided with an impurity region 121 that includes an N type impurity of the likes of phosphorus (P). The impurity region 121 is connected to the bit line BL via contacts Ch and Cb.

A lower end portion of the semiconductor layer 120 is connected to the P type well region 100P of the semiconductor substrate 100, via a semiconductor layer 122 configured from the likes of single crystal silicon (Si). The semiconductor layer 122 functions as the channel region of the source side select transistor STSb. An outer circumferential surface of the semiconductor layer 122 is surrounded by the conductive layer 111, and faces the conductive layer 111. An insulating layer 123 of the likes of silicon oxide is provided between the semiconductor layer 122 and the conductive layer 111.

The gate insulating film 130 has a substantially cylindrical shape covering the outer circumferential surface of the semiconductor layer 120.

The gate insulating film 130 comprises a tunnel insulating film 131, a charge accumulating film 132, and a block insulating film 133 that are laminated between the semiconductor layer 120 and the conductive layer 110, as shown in FIG. 13, for example. The tunnel insulating film 131 and the block insulating film 133 are insulating films of the likes of silicon oxide ($SiO_2$), for example. The charge accumulating film 132 is a film capable of accumulating a charge, of the likes of silicon nitride ($Si_3N_4$), for example. The tunnel insulating film 131, the charge accumulating film 132, and the block insulating film 133 have substantially cylindrical shapes, and extend in the Z direction along the outer circumferential surface of the semiconductor layer 120.

Note that FIG. 13 shows an example where the gate insulating film 130 comprises the charge accumulating film 132 of the likes of silicon nitride. However, the gate insulating film 130 may comprise a floating gate of the likes of polycrystalline silicon including an N type or P type impurity, for example.

As shown in FIG. 11, for example, the inter-finger-structure structure ST comprises: a conductive layer 140 extending in the Z direction and the X direction; and an insulating layer 141 provided on a side surface of the conductive layer 140. The conductive layer 140 is connected to an N type impurity region provided in the P type well region 100P of the semiconductor substrate 100. The conductive layer 140 may include, for example, a laminated film of a barrier conductive film of the likes of titanium nitride (TiN) and a metal film of the likes of tungsten (W), or the like. The conductive layer 140 functions as part of the source line SL (FIG. 5), for example.

[Structure in First Hookup Region HUR1 of Device Layer DL]

As shown in FIG. 10A, in the first hookup region HUR1, there are provided end portions in the X direction of the plurality of conductive layers 110 functioning as the drain side select gate line SGD. The inter-string-unit structure SHE (FIG. 10B) is provided between two of the conductive layers 110 adjacent in the Y direction, of these plurality of conductive layers 110.

Moreover, in the first hookup region HUR1, there are provided: a plurality of contacts CC aligned in a matrix-like manner in the X direction and the Y direction; and support structures HR provided in vicinities of these contacts CC. As shown in FIG. 9, for example, the contact CC extends in the Z direction, and, at its lower end, is connected to an upper surface of the conductive layer 110 functioning as the drain side select gate line SGD. The contact CC may include, for example, a laminated film of a barrier conductive film of the likes of titanium nitride (TiN) and a metal film of the likes of tungsten (W), or the like. The support structure HR may include a similar structure to those of the semiconductor layer 120 and the gate insulating film 130, for example.

[Structure in Second Hookup Region HUR2 of Device Layer DL]

As shown in FIG. 10A, in the second hookup region HUR2, there are provided parts of the plurality of conductive layers 110 functioning as the word lines WL or source side select gate line SGS.

Moreover, in the second hookup region HUR2, there are provided: a plurality of the contacts CC aligned in a matrix-like manner in the X direction and the Y direction; and the support structures HR provided in vicinities of these contacts CC. The plurality of contacts CC provided in the second hookup region HUR2 are respectively connected to upper surfaces of the plurality of conductive layers 110 functioning as the word lines WL or source side select gate line SGS.

[Structure in Peripheral Region PR of Device Layer DL]

The row decoder region RDR of FIG. 8 is provided with the block select circuit 23 (FIG. 5). Moreover, the address decoder region ADDR is provided with the address decoder 22 (FIG. 5). Moreover, the sense amplifier module region SAMR is provided with the sense amplifier module SAM (FIG. 4). Moreover, the cache memory region CR is provided with the cache memory CM (FIG. 4). Moreover, the driver region DRVR is provided with the voltage select circuit 24 (FIG. 4). Moreover, the peripheral circuit region PCR is provided with the voltage generating circuit VG, the sequencer SQC, the input/output control circuit I/O, the logic circuit CTR, and so on (FIG. 4).

As shown in FIG. 9, for example, the peripheral region PR of the semiconductor substrate 100 has a wiring layer GC provided therein via an unillustrated insulating layer. The wiring layer GC includes a plurality of electrodes gc that face the surface of the semiconductor substrate 100. Moreover, each of regions of the semiconductor substrate 100 and the plurality of electrodes gc included in the wiring layer GC are each connected to a contact CS.

The N type well region 100N, the P type well region 100P, and the semiconductor substrate region 100S of the semiconductor substrate 100 respectively function as the likes of the channel region of the plurality of transistors Tr configuring the peripheral circuit PC and one electrode of the plurality of capacitors configuring the peripheral circuit PC.

The plurality of electrodes gc included in the wiring layer GC respectively function as the likes of the gate electrode of the plurality of transistors Tr configuring the peripheral circuit PC and the other electrode of the plurality of capacitors configuring the peripheral circuit PC.

The contact CS extends in the Z direction, and, at its lower end, is connected to the semiconductor substrate 100 or an upper surface of the electrode gc. A connecting portion of the contact CS and the semiconductor substrate 100 is provided with an impurity region including an N type impurity or a P type impurity. The contact CS may include, for example, a laminated film of a barrier conductive film of the likes of titanium nitride (TiN) and a metal film of the likes of tungsten (W), or the like.

[Structure of Wiring Layers M0, M1, M2]

As shown in FIG. 9, for example, a plurality of wirings included in the wiring layers M0, M1, M2 are electrically connected to at least one of configurations in the memory cell array MCA and configurations in the peripheral circuit PC, via the above-mentioned contacts CC, CS, for example.

The wiring layers M0 each include a plurality of wirings m0. These plurality of wirings m0 may include, for example, a laminated film of a barrier conductive film of the likes of titanium nitride (TiN) and a metal film of the likes of tungsten (W), or the like.

The wiring layers M1 each include a plurality of wirings m1. These plurality of wirings m1 may include, for example, a laminated film of a barrier conductive film of the likes of titanium nitride (TiN) and a metal film of the likes of copper (Cu), or the like. Note that some of the plurality of wirings m1 function as the bit lines BL (FIG. 5). The bit lines BL are aligned in the X direction and extend in the Y direction, as shown in FIG. 10B, for example. Moreover, these plurality of bit lines BL are respectively connected to single semiconductor layers 120 included in each of the string units SU.

The wiring layers M2 each include a plurality of wirings m2, as shown in FIG. 9, for example. These plurality of wirings m2 may include, for example, a laminated film of a barrier conductive film of the likes of titanium nitride (TiN) and a metal film of the likes of aluminum (Al), or the like.

Note that some of the plurality of wirings m2 function as the pad electrodes P (FIGS. 2 and 3).

[Threshold Voltage of Memory Cell MC]

Figure 14:
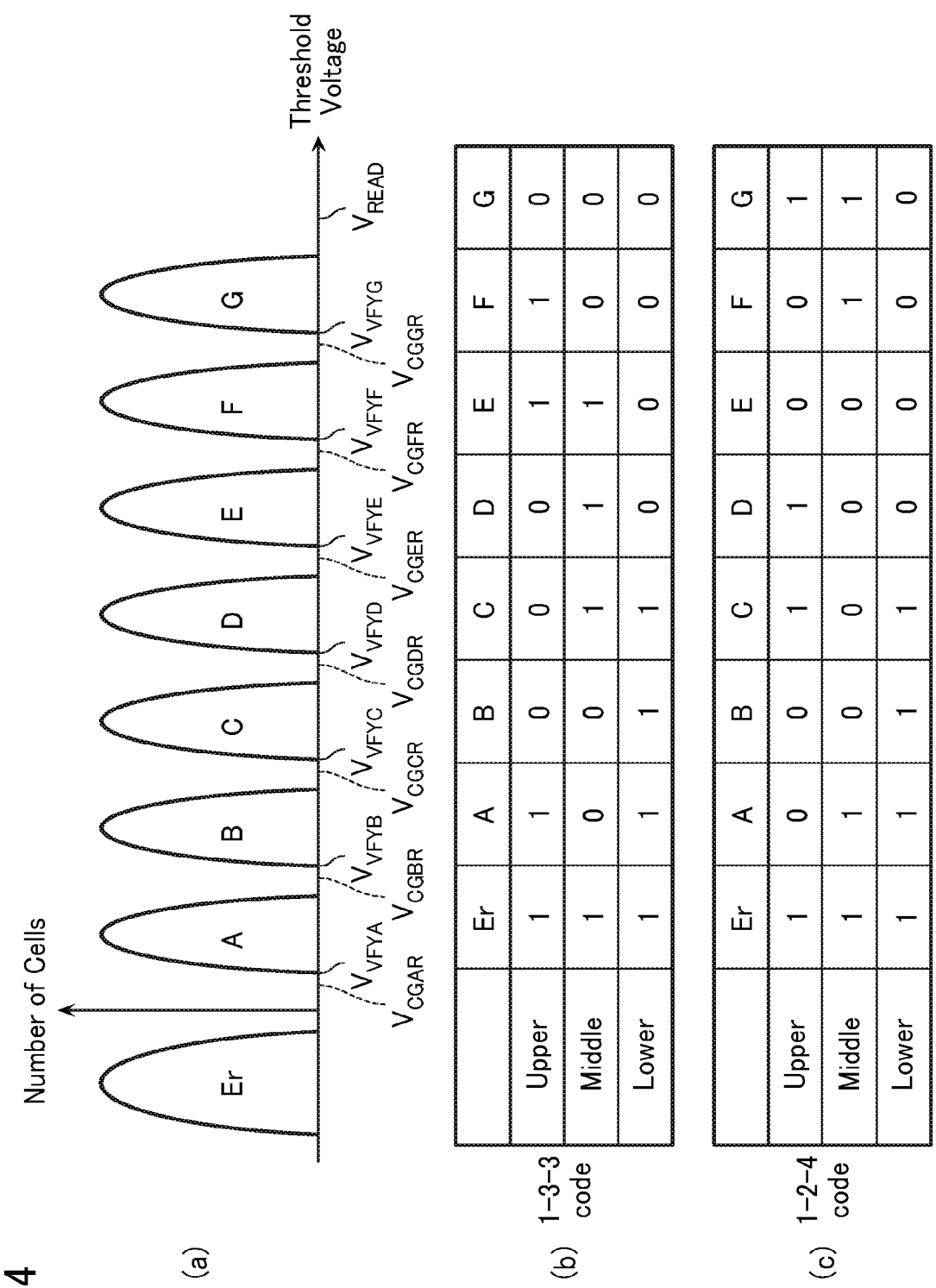
FIG. 14 is a schematic view for explaining a threshold voltage of a memory cell MC.

Next, threshold voltage of the memory cell MC will be described with reference to FIG. 14.

As mentioned above, the memory cell array MCA comprises a plurality of the memory cells MC. When a write sequence is performed on these plurality of memory cells MC, threshold voltages of these memory cells MC are controlled to a plurality of types of states.

FIG. 14(a) is a schematic histogram for explaining the threshold voltage of the memory cell MC recorded with 3 bits of data. The horizontal axis indicates voltage of the word line WL, and the vertical axis indicates number of memory cells MC. FIG. 14(b) is a table showing an example of a relationship of the threshold voltage of the memory cell MC recorded with 3 bits of data and the data recorded. FIG. 14(c) is a table showing another example of a relationship of the threshold voltage of the memory cell MC recorded with 3 bits of data and the data recorded.

In the example of FIG. 14(a), the threshold voltage of the memory cell MC is controlled to 8 types of states. For example, the threshold voltage of the memory cell MC controlled to an A state is larger than a read voltage $V_{CGAR}$ and a verify voltage $V_{VFYA}$ of FIG. 14(a) but smaller than a read voltage $V_{CGBR}$ and a verify voltage $V_{VFYB}$ of FIG. 14(a). Moreover, the threshold voltages of all the memory cells MC are smaller than a read pass voltage $V_{READ}$ of FIG. 14(a).

For example, an Er state corresponds to a lowest threshold voltage (a threshold voltage of the memory cell MC in an erased state). The memory cell MC corresponding to the Er state is assigned with data "111", for example.

Moreover, the A state corresponds to a threshold voltage which is higher than the threshold voltage corresponding to the above-described Er state. The memory cell MC corresponding to the A state is assigned with data "101", for example.

Moreover, a B state corresponds to a threshold voltage which is higher than the threshold voltage corresponding to the above-described A state. The memory cell MC corresponding to the B state is assigned with data "001", for example.

The same applies hereafter, that is, C through G states in FIG. 14(a) respectively correspond to threshold voltages which are higher than the threshold voltages corresponding to the B through F states. The memory cells MC corresponding to these distributions are respectively assigned with data "011", "010", "110", "100", "000", for example.

Note that in the case of assignation of the kind exemplified in FIG. 14(b), lower bit data is discriminable by the single read voltage $V_{CGDR}$, middle bit data is discriminable by the three read voltages $V_{CGAR}$, $V_{CGCR}$, $V_{CGFR}$, and upper bit data is discriminable by the three read voltages $V_{CGBR}$, $V_{CGER}$, $V_{CGGR}$. This kind of data assignation is sometimes called a 1-3-3 code.

Note that the number of bits of data recorded in the memory cell MC, the number of states, the assignation of data to each of the states, and so on, may be appropriately changed.

For example, in the case of assignation of the kind exemplified in FIG. 14(c), lower bit data is discriminable by the single read voltage $V_{CGDR}$, middle bit data is discriminable by the two read voltages $V_{CGBR}$, $V_{CGFR}$, and upper bit data is discriminable by the four read voltages $V_{CGAR}$, $V_{CGCR}$, $V_{CGER}$, $V_{CGGR}$. This kind of data assignation is sometimes called a 1-2-4 code.

[Read Operation]

Figure 15A:
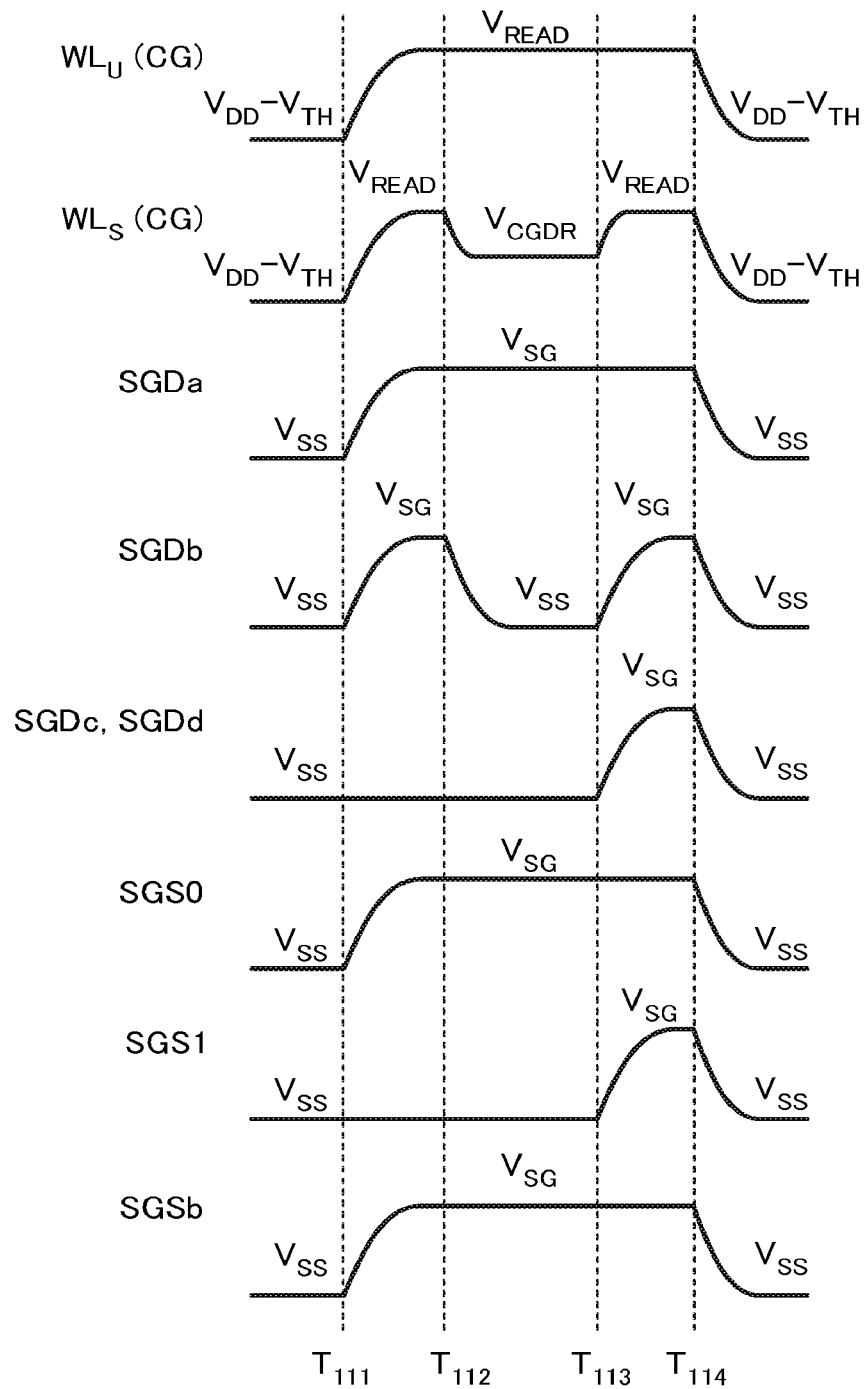
FIG. 15A is a schematic waveform diagram for explaining a read operation according to the first embodiment.
Figure 15B:
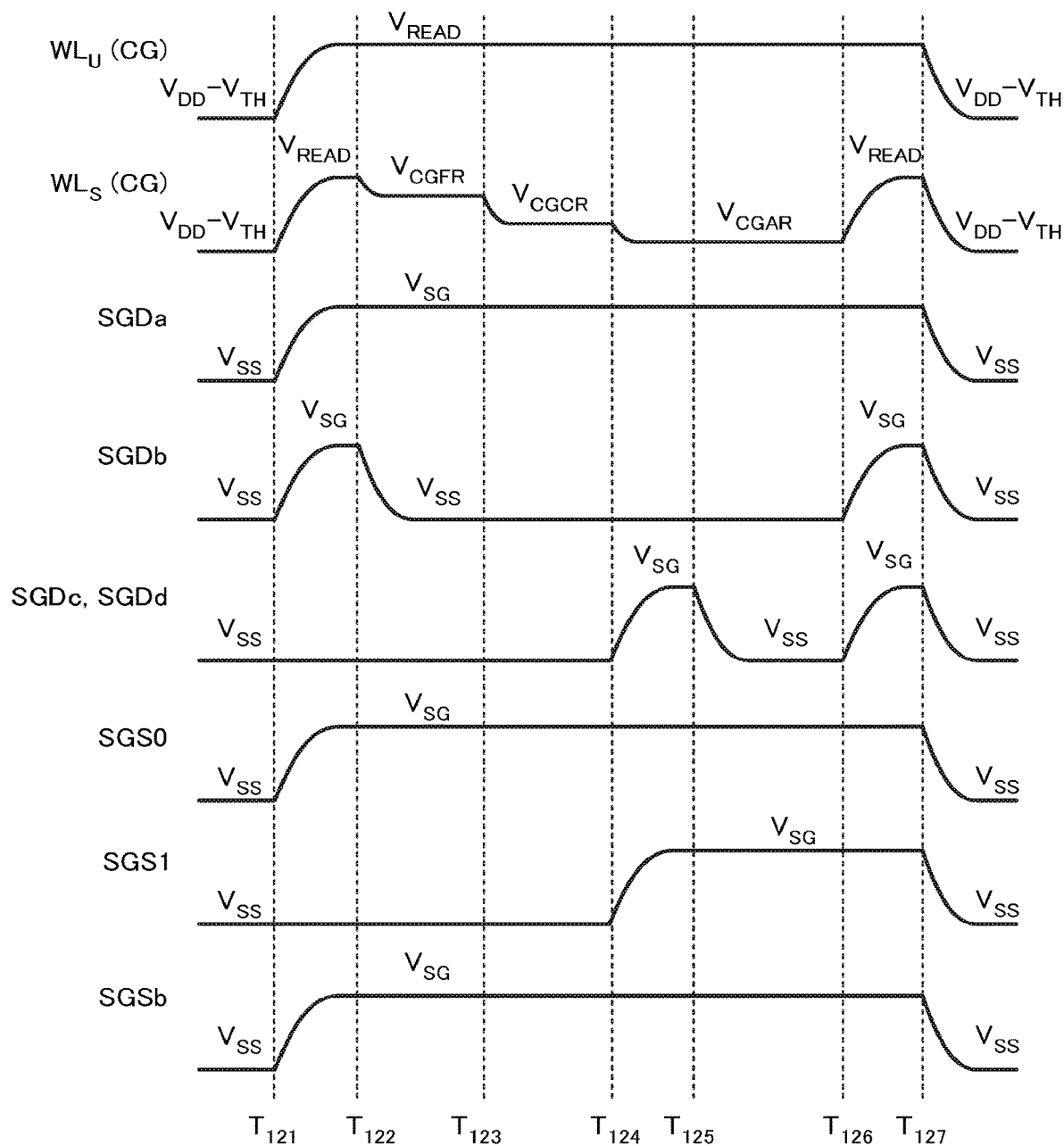
FIG. 15B is a schematic waveform diagram for explaining same read operation.
Figure 15C:
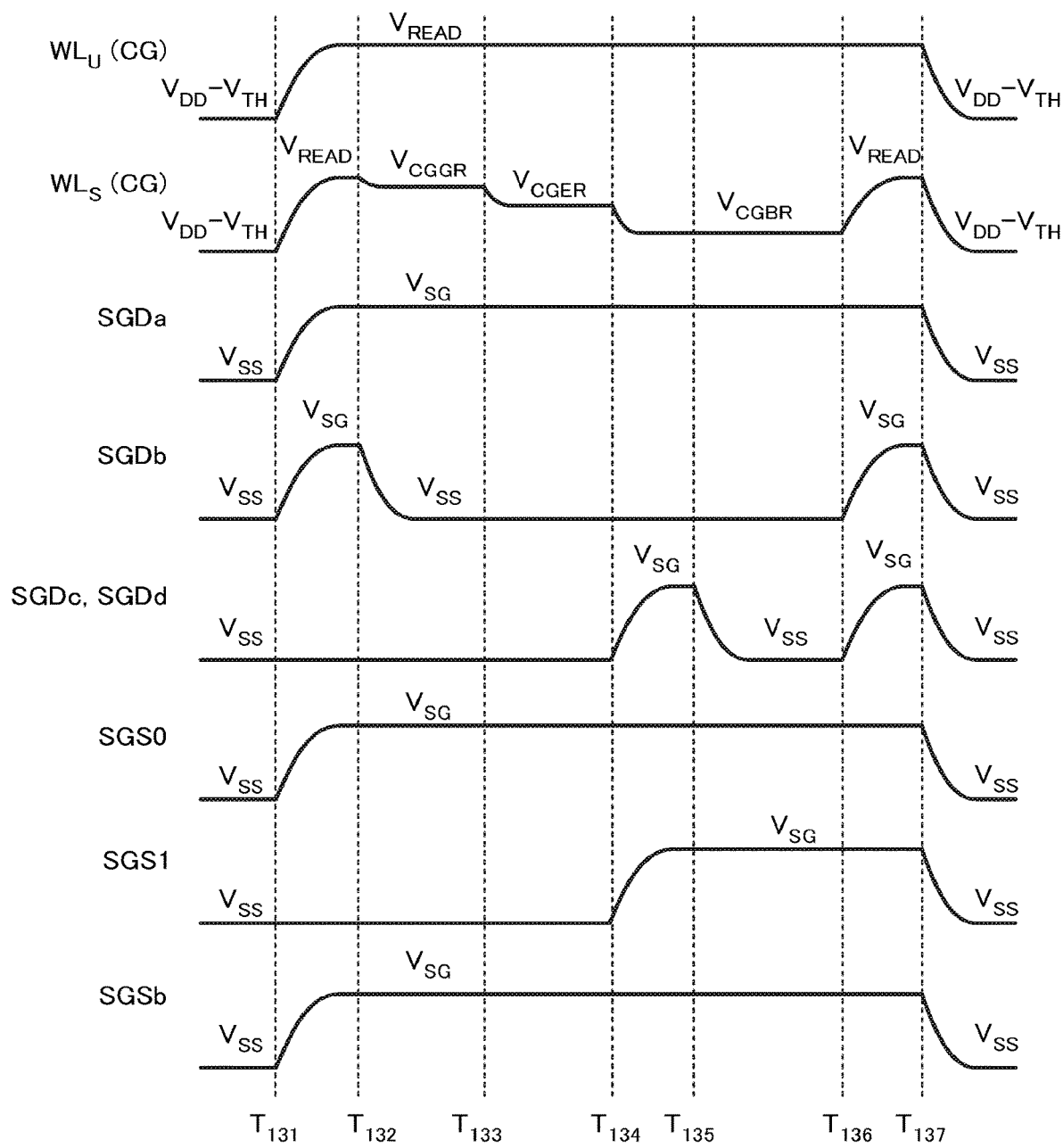
FIG. 15C is a schematic waveform diagram for explaining same read operation.

Next, a read operation of the semiconductor memory device according to the present embodiment will be described with reference to FIGS. 14, 15A to 15C, and 16A to 16D. FIGS. 15A to 15C are schematic waveform diagrams for explaining the read operation. FIGS. 16A to 16D are schematic cross-sectional views for explaining the read operation.

Note that in the description below, the two finger structures FS in the memory block BLK representing a target of operation will sometimes be respectively called finger structures FS0, FS1. Moreover, the source side select gate lines SGS corresponding to the finger structures FS0, FS1 will sometimes be respectively called source side select gate lines SGS0, SGS1. Moreover, the two string units SU in the finger structure FS0 will sometimes be respectively called string units SUa, SUb. Moreover, the two string units SU in the finger structure FS1 will sometimes be respectively called string units SUc, SUd. Moreover, the drain side select gate lines SGD corresponding to the string units SUa, SUb, SUc, SUd will sometimes be respectively called drain side select gate lines SGDa, SGDb, SGDc, SGDd. Moreover, sometimes, the word line WL representing a target of operation, of the plurality of word lines WL in the memory block BLK representing a target of operation will be called a selected word line $WL_S$, and other word lines WL will be called unselected word lines $WL_U$. Moreover, the description below describes an example where, of the plurality of memory cells MC included in the string unit SUa, those that are connected to the selected word line $WL_S$ (hereafter, these will sometimes be called "selected memory cells MC") undergo execution of the operation. Moreover, in the description below, a configuration including such a plurality of selected memory cells MC will sometimes be called a selected page p. Moreover, the description below describes an example where the memory cell MC is assigned with data according to the 1-3-3 code of FIG. 14(b).

[Read Operation of Lower Bit]

At a time of read of the lower bit, for example, charging of the bit line BL, and so on, is performed. For example, "H" is latched in the latch circuit SDL of FIG. 7B, and states of the signal lines STB, XXL, BLC, BLS, HLL, BLX are set to "L, L, H, H, H, H". As a result, the bit line BL and the sense node SEN are supplied with the voltage $V_{DD}$, and charging thereof is started. Moreover, for example, the source line SL (FIG. 5) is supplied with the voltage $V_{SRC}$, whereby charging thereof is started. The voltage $V_{SRC}$ has a magnitude of the same degree as the ground voltage $V_{SS}$, for example. The voltage $V_{SRC}$ is larger than the ground voltage $V_{SS}$, but smaller than the voltage $V_{DD}$, for example.

Figure 16A:
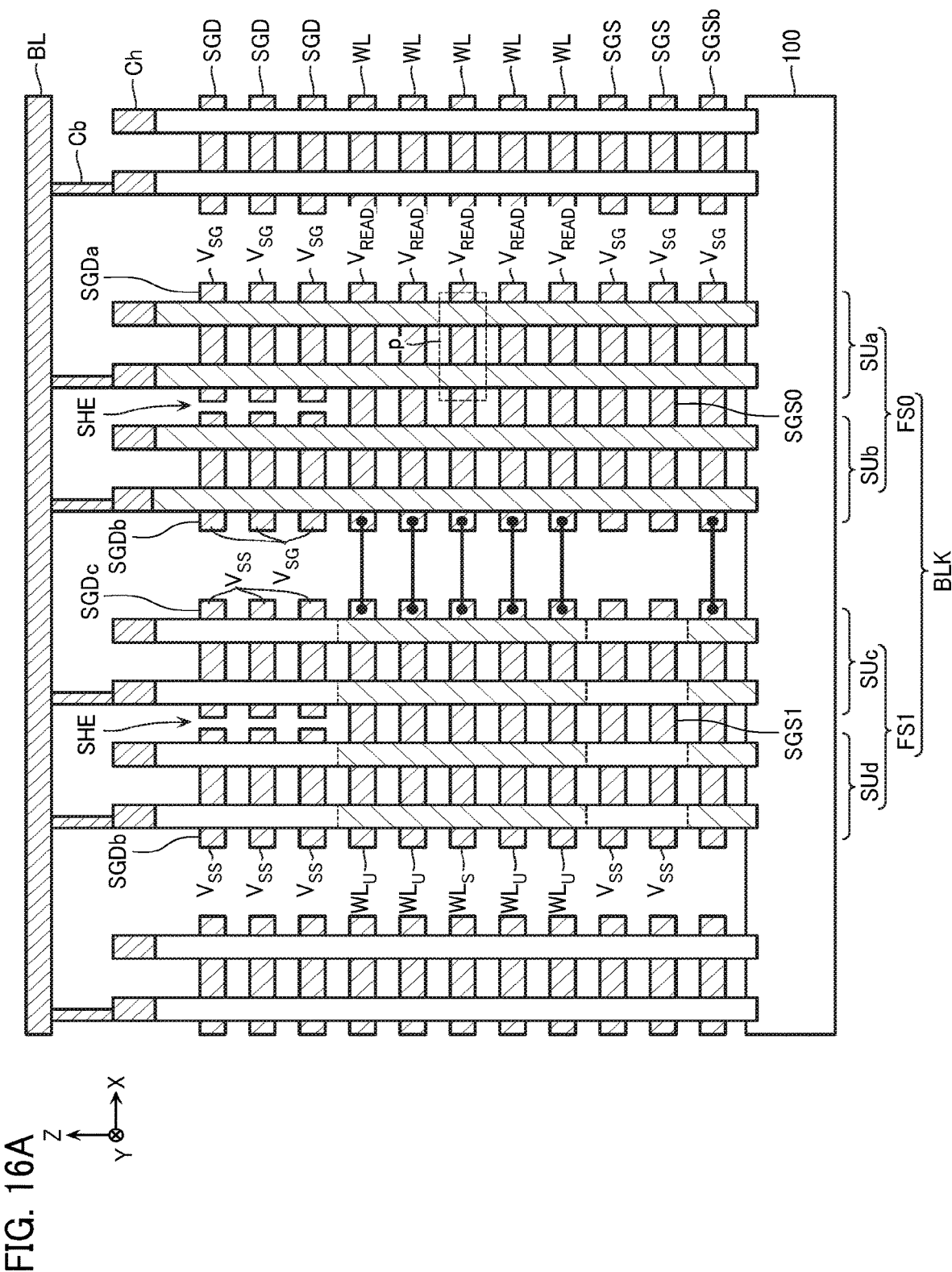
FIG. 16A is schematic cross-sectional view for explaining same read operation.

Next, at timing $T_{111}$ (FIG. 15A) for example, the selected word line $WL_S$ and the unselected word lines $WL_U$ are supplied with the read pass voltage $V_{READ}$, the select gate lines (SGDa, SGDb, SGS0, SGSb) corresponding to the string units SUa, SUb are supplied with a voltage $V_{SG}$, and the select gate lines (SGDc, SGDd, SGS1) corresponding to the string units SUc, SUd are supplied with the ground voltage $V_{SS}$. As a result, as shown in FIG. 16A, for example, the memory cells MC included in the string units SUa, SUb, SUc, SUd and the select gate transistors (STD, STS, STSb) included in the string units SUa, SUb attain an ON state. Moreover, the drain side select transistors STD and the source side select transistors STS corresponding to the string units SUc, SUd attain an OFF state.

Figure 16B:
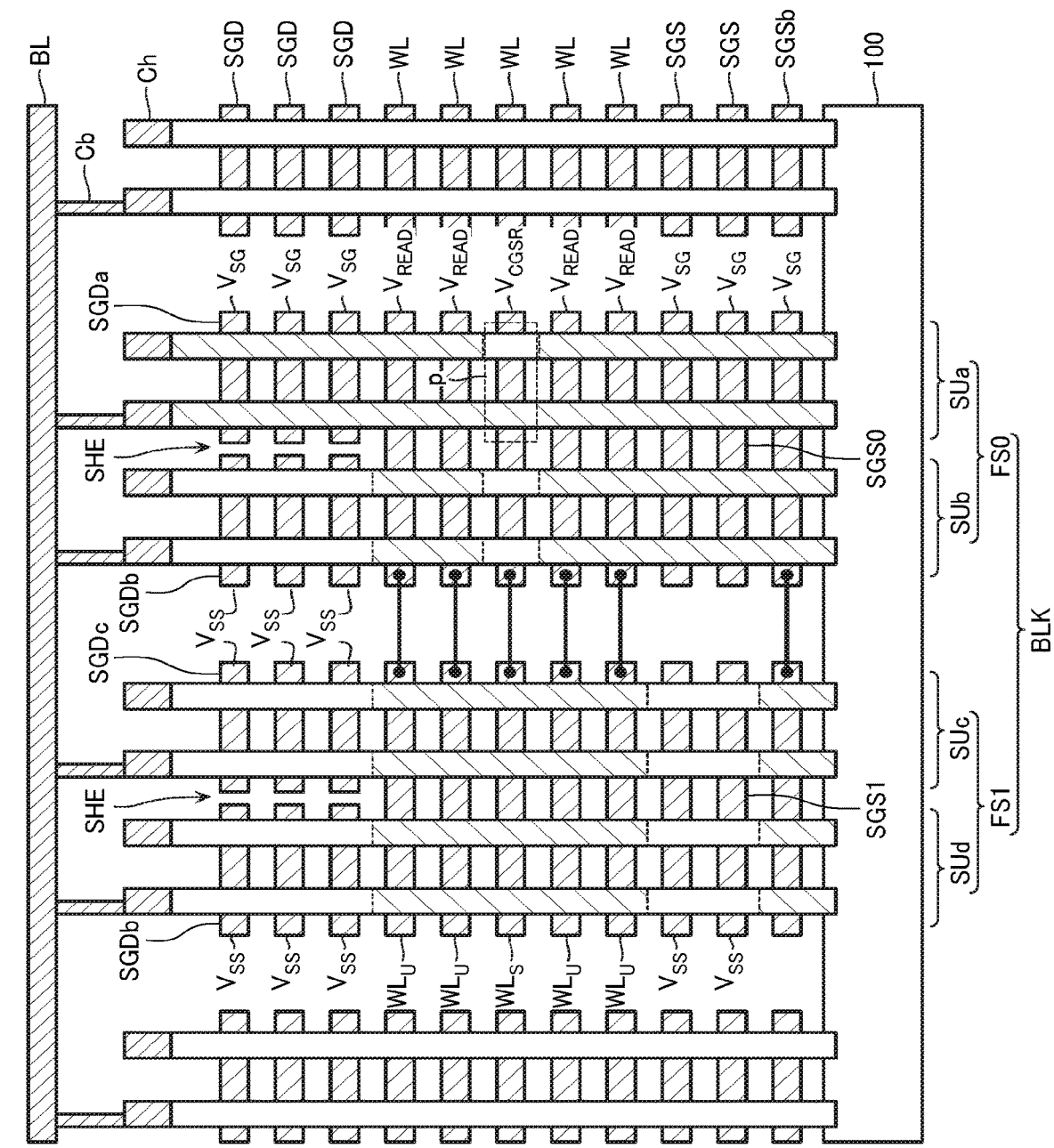
FIG. 16B is schematic cross-sectional view for explaining same read operation.

Next, at timing $T_{112}$ (FIG. 15A), for example, the selected word line $WL_S$ is supplied with the read voltage $V_{CGDR}$, the unselected word lines $WL_U$ are supplied with the read pass voltage $V_{READ}$, the select gate lines (SGDa, SGS0, SGSb) corresponding to the string unit SUa are supplied with the voltage $V_{SG}$, and the drain side select gate line SGDb corresponding to the string unit SUb and drain side select gate lines SGDc, SGDd and source side select gate line SGS1 corresponding to the string units SUc, SUd are supplied with the ground voltage $V_{SS}$. As a result, as shown in FIG. 16B, for example, those memory cells MC that have been controlled to the Er state, the A state, the B state, or the C state, of the plurality of memory cells MC connected to the selected word line $WL_S$ attain an ON state, and those memory cells MC that have been controlled to the D state, the E state, the F state, or the G state, of the plurality of memory cells MC connected to the selected word line $WL_S$ attain an OFF state. Moreover, the select transistors (STD, STS, STSb) corresponding to the string unit SUa attain an ON state, and the memory cells MC included in the selected page p are electrically continuous with the bit lines BL and the source line SL (FIG. 5). Moreover, the drain side select transistors STD corresponding to the string unit SUb attain an OFF state, and the source side select transistors STS, STSb corresponding to the string unit SUb attain an ON state. As a result, some of the memory cells MC connected to the selected word line $WL_S$ in the string unit SUb attain an ON state, and some of the memory cells MC connected to the selected word line $WL_S$ in the string unit SUb attain an OFF state. Moreover, the memory cell MC that has attained an ON state is electrically separated from the bit line BL, and is electrically continuous with the source line SL (FIG. 5). Moreover, the channels of the memory cells MC connected between the memory cell MC that has attained an OFF state and the bit line BL are electrically separated from the bit line BL and the source line SL to attain a floating state. Moreover, the channels of the memory cells MC connected between the memory cell MC that has attained an OFF state and the source line SL are electrically continuous with the source line SL (FIG. 5). Moreover, the drain side select transistors STD and the source side select transistors STS corresponding to the string units SUc, SUd attain an OFF state. As a result, the memory cells MC connected to the selected word line $WL_S$ in the string units SUc, SUd are electrically separated from the bit line BL and the source line SL (FIG. 5).

Next, at a timing between timings $T_{112}$, $T_{113}$ (FIG. 15A), for example, ON state/OFF state of the selected memory cells MC is detected. For example, the wiring LBUS is charged via the charge transistor 55 of FIG. 7B. Moreover, states of the signal lines STB, XXL, BLC, BLS, HLL, BLX are set to "L, H, H, H, L, H", and a charge of the sense node SEN is discharged to the bit line BL. Now, voltage of the sense node SEN connected to the bit line BL corresponding to the memory cell MC in an ON state decreases comparatively greatly. On the other hand, voltage of the sense node SEN connected to the bit line BL corresponding to the memory cell MC in an OFF state does not decrease very much. Hence, by setting the signal line STB to "H" state to discharge or maintain a charge of the wiring LBUS, and setting the signal line STL to "H" state at a certain timing, data indicating states of the selected memory cells MC is latched in the latch circuit SDL.

Figure 16C:
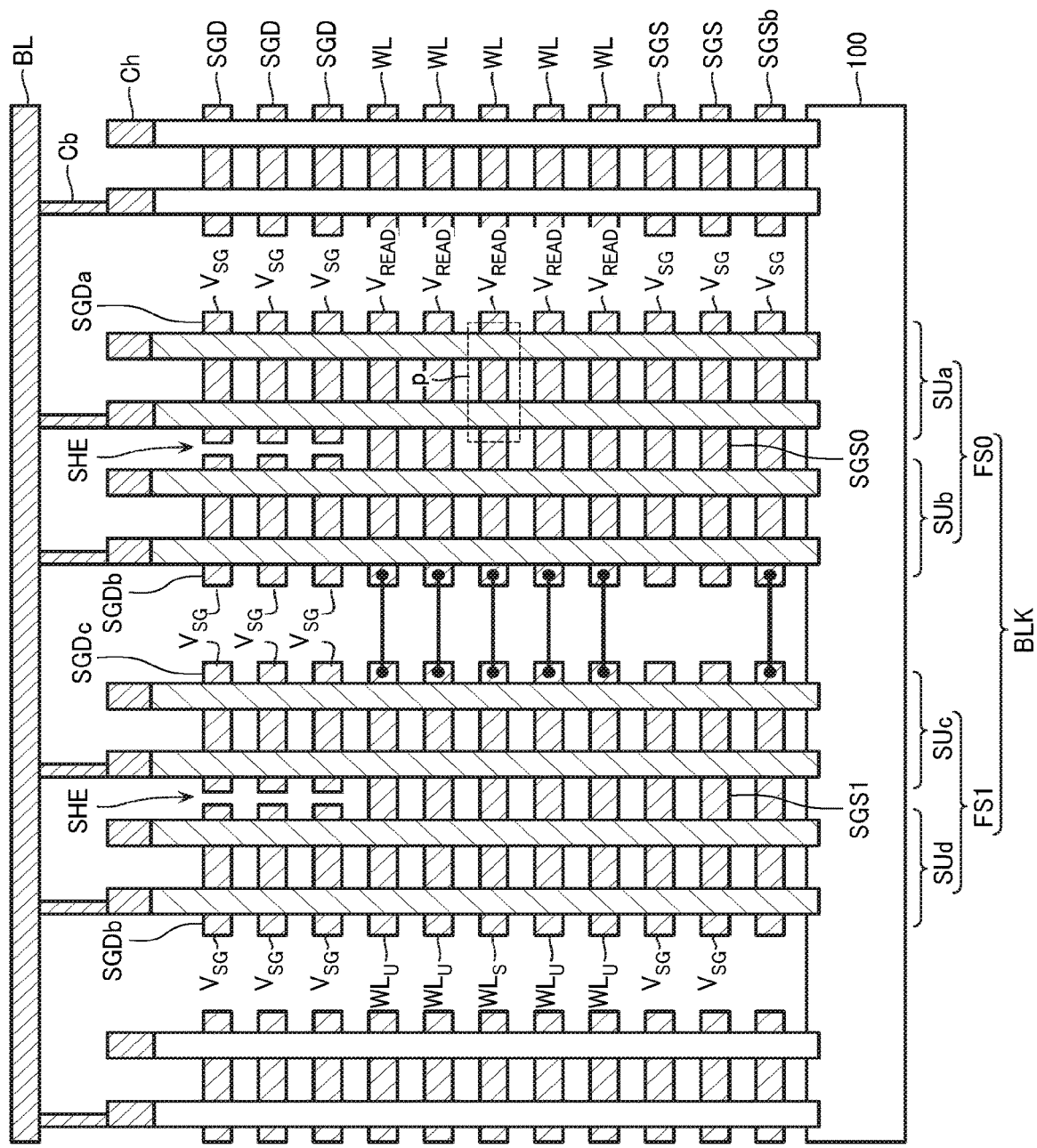
FIG. 16C is schematic cross-sectional view for explaining same read operation.

Next, at timing $T_{113}$ (FIG. 15A), for example, the selected word line $WL_S$ and the unselected word lines $WL_U$ are supplied with the read pass voltage $V_{READ}$, and the select gate lines (SGD, SGS, SGSb) corresponding to the string units SUa, SUb, SUc, SUd are supplied with the voltage $V_{SG}$. As a result, as shown in FIG. 16C, for example, the memory cells MC and the select gate transistors (STD, STS, STSb) corresponding to the string units SUa, SUb, SUc, SUd attain an ON state.

Next, at timing $T_{114}$ (FIG. 15A), for example, the selected word line $WL_S$ and the unselected word lines $WL_U$ are supplied with a voltage $V_{DD}$-$V_{TH}$, and the select gate lines (SGD, SGS, SGSb) corresponding to the string units SUa, Sub, SUc, SUd are supplied with the ground voltage $V_{SS}$. A voltage $V_{TH}$ is a threshold voltage of the NMOS transistor whose threshold voltage is largest, of the plurality of NMOS transistors connected between the word line WL and the output terminal (voltage supply line 31) of the charge pump circuit 32 outputting the voltage $V_{DD}$. As a result, the memory cells MC and the select gate transistors (STD, STS, STSb) corresponding to the string units SUa, SUb, SUc, SUd attain an OFF state.

Subsequently, the data detected by the sense amplifier module SAM is outputted. For example, the data detected by the sense amplifier module SAM is transferred to the control die CD (FIG. 1), via the cache memory CM (FIG. 4), the bus DB, and the input/output control circuit I/O. The control die CD transfers this data to the host computer 20 after having performed bit error detection/correction, and so on, on the data.

[Read Operation of Middle Bit]

At a time of read of the middle bit, for example, charging of the bit line BL, and so on, is performed.

Next, at timing $T_{121}$ (FIG. 15B), for example, the selected word line $WL_S$ and the unselected word lines $WL_U$ are supplied with the read pass voltage $V_{READ}$, the select gate lines (SGDa, SGDb, SGS0, SGSb) corresponding to the string units SUa, SUb are supplied with the voltage $V_{SG}$, and the drain side select gate lines SGDc, SGDd and source side select gate line SGS1 corresponding to the string units SUc, SUd are supplied with the ground voltage $V_{SS}$.

Next, at timing $T_{122}$ (FIG. 15B), for example, the selected word line $WL_S$ is supplied with the read voltage $V_{CGFR}$, the unselected word lines $WL_U$ are supplied with the read pass voltage $V_{READ}$, the select gate lines (SGDa, SGS0, SGSb) corresponding to the string unit SUa are supplied with the voltage $V_{SG}$, and the drain side select gate line SGDb corresponding to the string unit SUb and drain side select gate lines SGDc, SGDd and source side select gate line SGS1 corresponding to the string units SUc, SUd are supplied with the ground voltage $V_{SS}$. As a result, those memory cells MC that have been controlled to any of the Er state and the A through E states, of the plurality of memory cells MC connected to the selected word line $WL_S$ attain an ON state, and those memory cells MC that have been controlled to the F state or the G state, of the plurality of memory cells MC connected to the selected word line $WL_S$ attain an OFF state.

Next, at a timing between timings $T_{122}$, $T_{123}$ (FIG. 15B), for example, ON state/OFF state of the selected memory cells MC is detected.

Next, at timing $T_{123}$ (FIG. 15B), for example, the selected word line $WL_S$ is supplied with the read voltage $V_{CGCR}$, the unselected word lines $WL_U$ are supplied with the read pass voltage $V_{READ}$, the select gate lines (SGDa, SGS0, SGSb) corresponding to the string unit SUa are supplied with the voltage $V_{SG}$, and the drain side select gate line SGDb corresponding to the string unit SUb and drain side select gate lines SGDc, SGDd and source side select gate line SGS1 corresponding to the string units SUc, SUd are supplied with the ground voltage $V_{SS}$. As a result, those memory cells MC that have been controlled to any of the Er state, the A state, and the B state, of the plurality of memory cells MC connected to the selected word line $WL_S$ attain an ON state, and those memory cells MC that have been controlled to any of the C through G states, of the plurality of memory cells MC connected to the selected word line $WL_S$ attain an OFF state.

Next, at a timing between timings $T_{123}$, $T_{124}$ (FIG. 15B), for example, ON state/OFF state of the selected memory cells MC is detected.

Figure 16D:
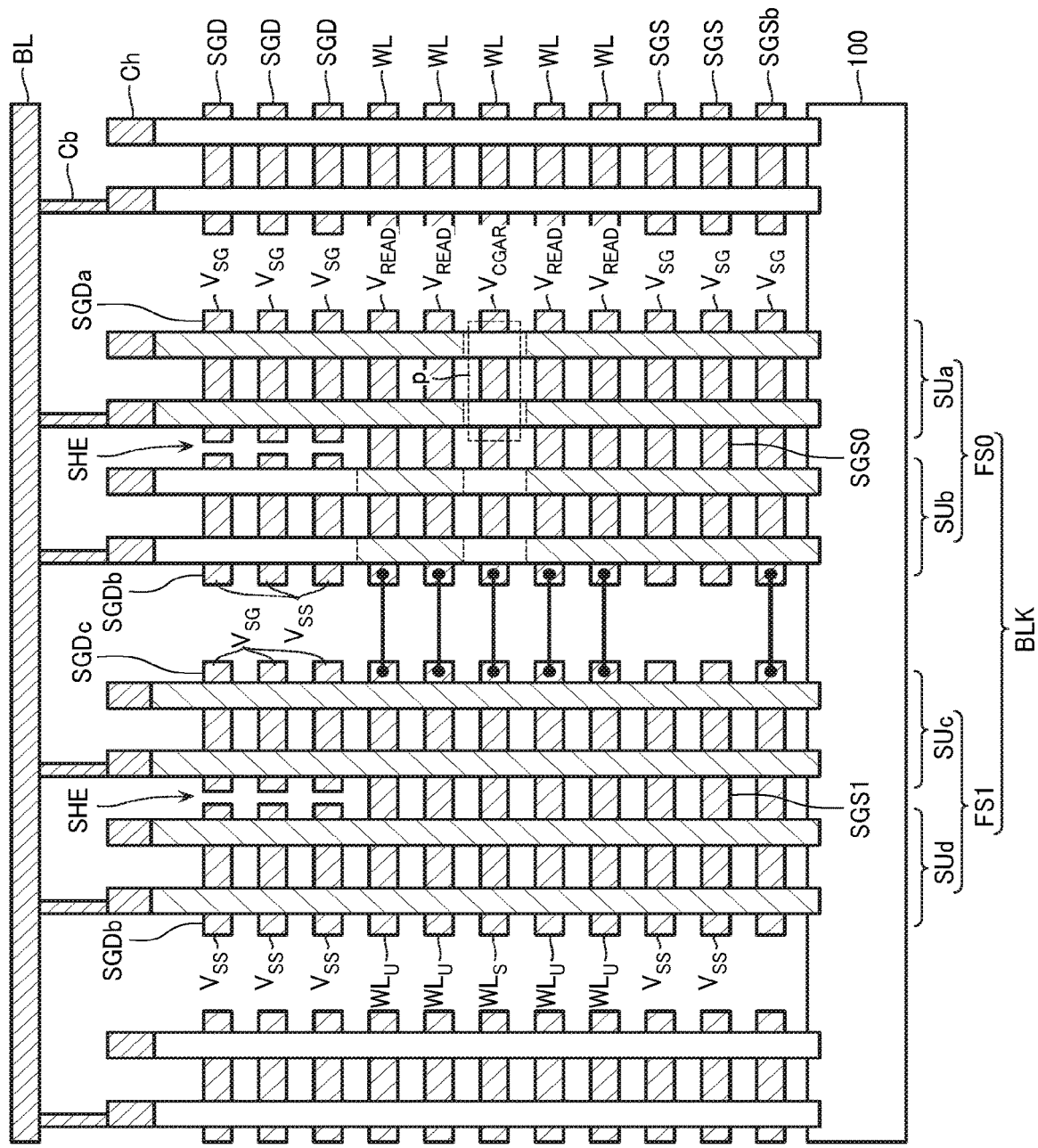
FIG. 16D is schematic cross-sectional view for explaining same read operation.

Next, at timing $T_{124}$ (FIG. 15B), for example, the selected word line $WL_S$ is supplied with the read voltage $V_{CGAR}$, the unselected word lines $WL_U$ are supplied with the read pass voltage $V_{READ}$, the select gate lines (SGDa, SGDc, SGDd, SGS0, SGS1, SGSb) corresponding to the string units SUa, SUc, SUd are supplied with the voltage $V_{SG}$, and the drain side select gate line SGDb corresponding to the string unit SUb is supplied with the ground voltage $V_{SS}$. As a result, as shown in FIG. 16D, for example, some of the memory cells MC included in the string units SUa, SUb, SUc, SUd, the drain side select transistors STD corresponding to the string units SUa, SUc, SUd, and the select gate transistors (STD, STS, STSb) corresponding to the string units SUa, SUb, SUc, SUd attain an ON state. Moreover, some of the memory cells MC included in the string units SUa, SUb, SUc, SUd, and the drain side select transistor STD corresponding to the string unit SUb attain an OFF state.

Next, at timing $T_{125}$ (FIG. 15B), for example, the selected word line $WL_S$ is supplied with the read voltage $V_{CGAR}$, the unselected word lines $WL_U$ are supplied with the read pass voltage $V_{READ}$, the drain side select gate line SGDa corresponding to the string unit SUa and source side select gate lines SGS0, SGS1, SGSb corresponding to the string units SUa, SUb, SUc, SUd are supplied with the voltage $V_{SG}$, and the drain side select gate lines SGDb, SGDc, SGDd corresponding to the string units SUb, SUc, SUd are supplied with the ground voltage $V_{SS}$. As a result, those memory cells MC that have been controlled to the Er state, of the plurality of memory cells MC connected to the selected word line $WL_S$ attain an ON state, and those memory cells MC that have been controlled to any of the A through G states, of the plurality of memory cells MC connected to the selected word line $WL_S$ attain an OFF state.

Next, at a timing between timings $T_{125}$, $T_{126}$ (FIG. 15B), for example, ON state/OFF state of the selected memory cells MC is detected.

Next, at timing $T_{126}$ (FIG. 15B), for example, the selected word line $WL_S$ and the unselected word lines $WL_U$ are supplied with the read pass voltage $V_{READ}$, and the select gate lines (SGD, SGS, SGSb) corresponding to the string units SUa, SUb, SUc, SUd are supplied with the voltage $V_{SG}$.

Next, at timing $T_{127}$ (FIG. 15B), for example, the selected word line $WL_S$ and the unselected word lines $WL_U$ are supplied with the voltage $V_{DD}$-$V_{TH}$, and the select gate lines (SGD, SGS, SGSb) corresponding to the string units SUa, SUb, SUc, SUd are supplied with the ground voltage $V_{SS}$.

Subsequently, the data detected by the sense amplifier module SAM is outputted.

[Read Operation of Upper Bit]

Read of the upper bit is performed substantially similarly to read of the middle bit, as shown in FIG. 15C, for example. However, at the time of read of the middle bit, the three kinds of read voltages $V_{CGFR}$, $V_{CGCR}$, $V_{CGAR}$ were successively supplied to the selected word line $WL_S$. On the other hand, as shown in FIG. 15C, for example, at a time of read of the upper bit, the three kinds of read voltages $V_{CGGR}$, $V_{CGER}$, $V_{CGBR}$ are successively supplied to the selected word line $WL_S$. Note that timings $T_{131}$ through $T_{137}$ in FIG. 15C are timings corresponding to the timings $T_{121}$ through $T_{127}$ in FIG. 15B.

[Write Sequence]

Figure 17:
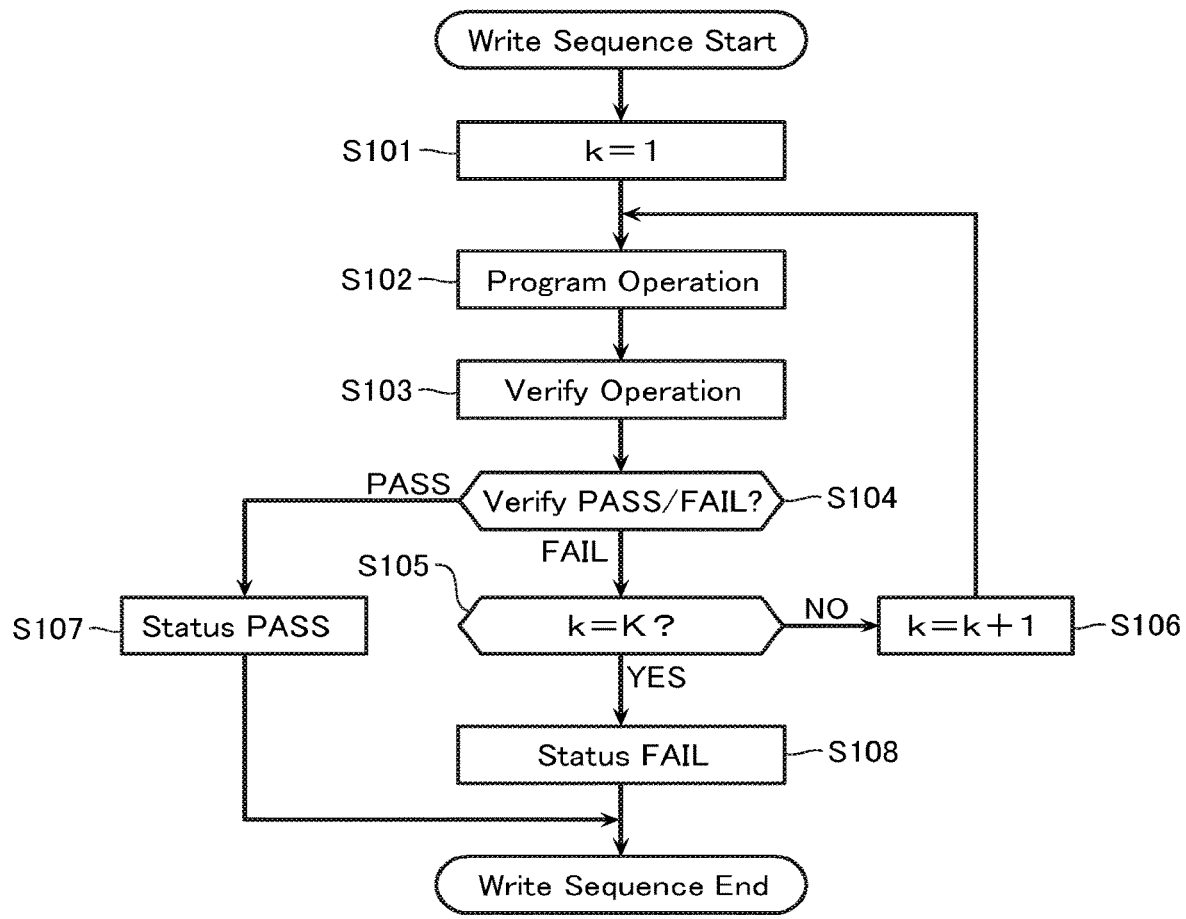
FIG. 17 is a schematic flowchart for explaining a write sequence.
Figure 18:
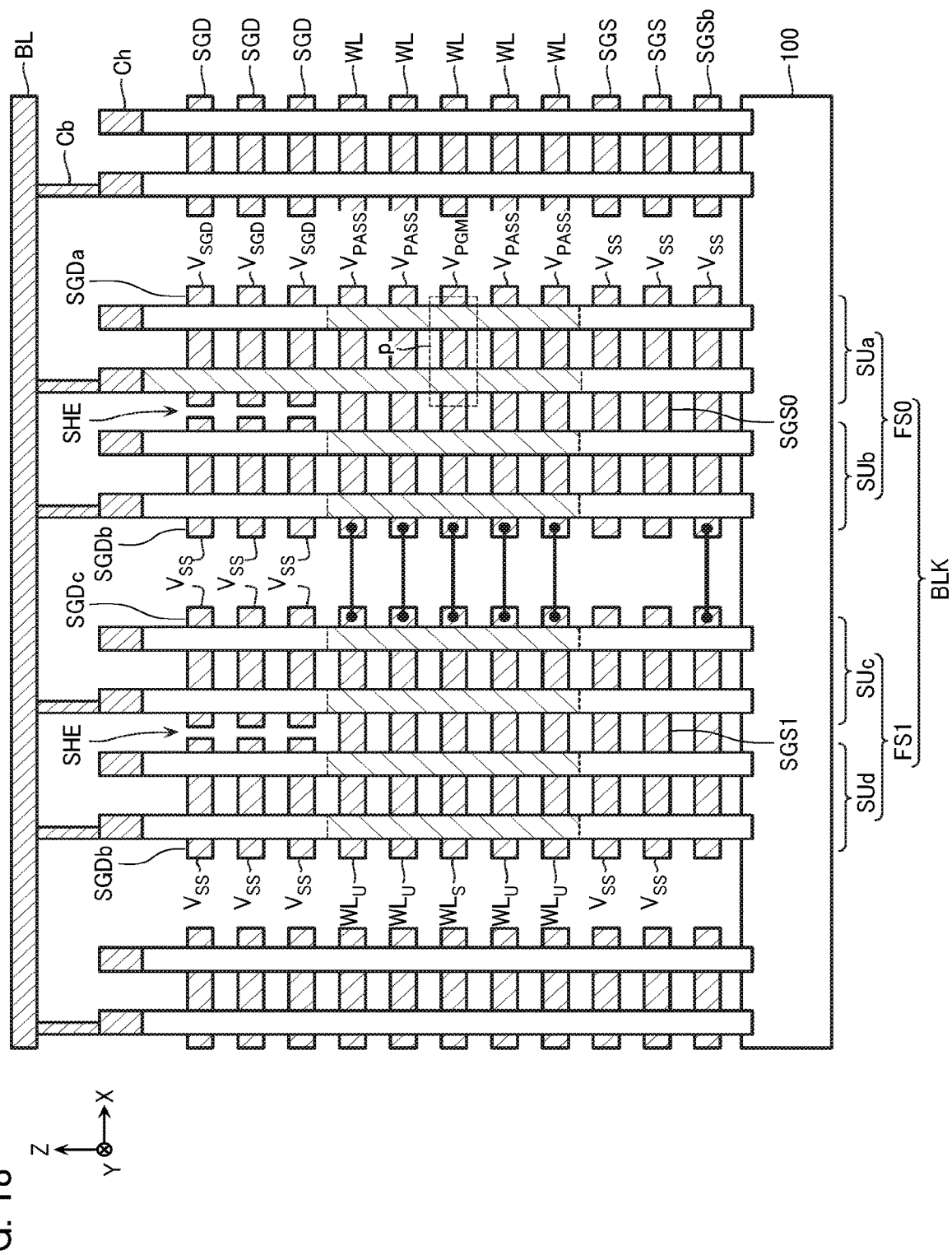
FIG. 18 is a schematic cross-sectional view for explaining a program operation.
Figure 19:
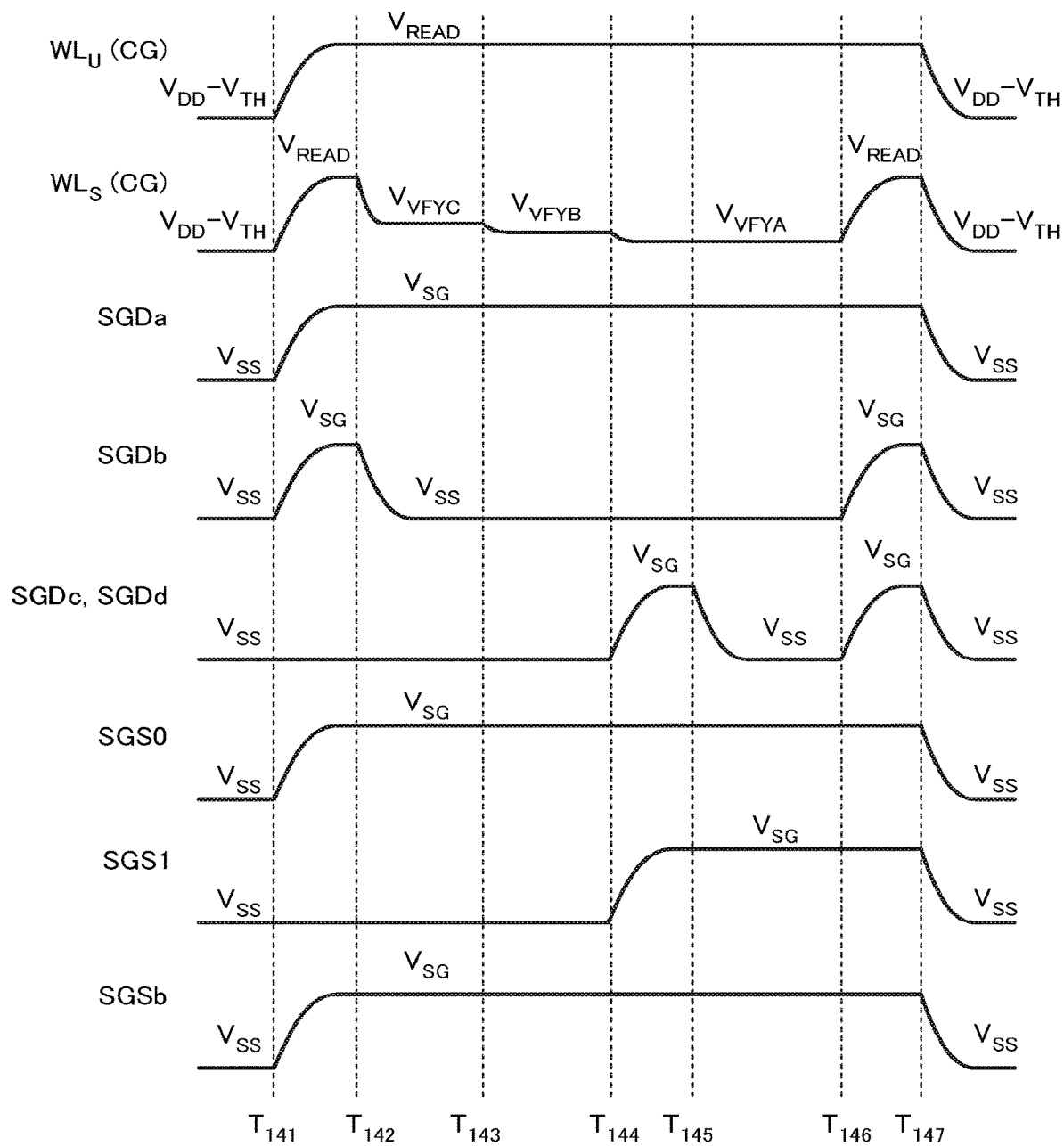
FIG. 19 is a schematic waveform diagram for explaining a verify operation.
Figure 20:
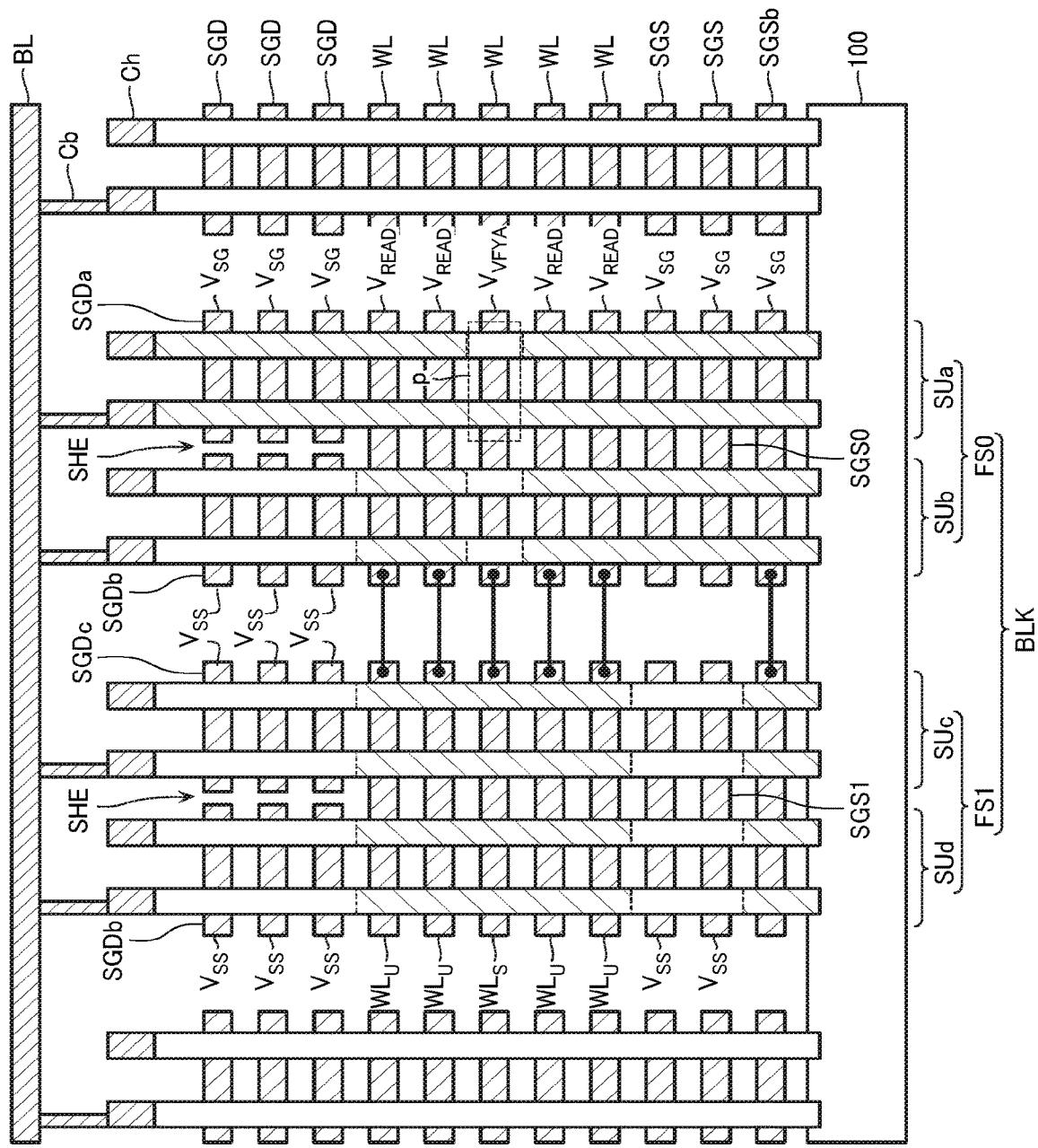
FIG. 20 is a schematic cross-sectional view for explaining the verify operation.

Next, a write sequence of the semiconductor memory device will be described with reference to FIGS. 17 to 20. The write sequence includes a program operation and a verify operation. FIG. 17 is a schematic flowchart for explaining the write sequence. FIG. 18 is a schematic cross-sectional view for explaining the program operation. FIG. 19 is a schematic waveform diagram for explaining the verify operation. FIG. 20 is a schematic cross-sectional view for explaining the verify operation.

In step S101 (FIG. 17), a loop count k is set to 1. The loop count k is recorded in a register, or the like.

In step S102, the program operation is performed.

At a time of the program operation, for example, the bit line BL connected to the memory cell MC which is to undergo adjustment of its threshold voltage, of the plurality of selected memory cells MC (hereafter, this memory cell MC will sometimes be called a "write memory cell MC") is supplied with the voltage $V_{SRC}$, and the bit line BL connected to the memory cell MC which is not to undergo adjustment of its threshold voltage, of the plurality of selected memory cells MC (hereafter, this memory cell MC will sometimes be called a "prohibited memory cell MC") is supplied with the voltage $V_{DD}$. For example, "L" is latched in the latch circuit SDL (FIG. 7B) corresponding to the write memory cell MC, and "H" is latched in the latch circuit SDL (FIG. 7B) corresponding to the prohibited memory cell MC. Moreover, states of the signal lines STB, XXL, BLC, BLS, HLL, BLX are set to "L, L, H, H, L, H".

Moreover, as shown in FIG. 18, the write memory cell MC is selectively made electrically continuous with the bit line BL. For example, the drain side select gate line SGDa is supplied with a voltage $V_{SGD}$, and the other drain side select gate lines SGD are supplied with the ground voltage $V_{SS}$. The voltage $V_{SGD}$ is smaller than the voltage $V_{SG}$, for example. As a result, the drain side select transistor STD corresponding to the bit line BL supplied with the voltage $V_{SRC}$ attains an ON state, and the drain side select transistor STD corresponding to the bit line BL supplied with the voltage $V_{DD}$ attains an OFF state. Moreover, the unselected word lines $WL_U$ corresponding to unselected pages are supplied with a write pass voltage $V_{PASS}$. The write pass voltage $V_{PASS}$ is larger than the read pass voltage $V_{READ}$, for example.

Moreover, as shown in FIG. 18, the selected word line $WL_S$ is supplied with a program voltage $V_{PGM}$. The program voltage $V_{PGM}$ is larger than the write pass voltage $V_{PASS}$. As a result, electrons are accumulated in the charge accumulating film 132 (FIG. 13) of a desired memory cell MC, and the threshold voltage of the memory cell MC increases.

In step S103 (FIG. 17), the verify operation is performed.

The verify operation is executed substantially similarly to the read operation, as shown in FIGS. 19 and 20, for example.

However, at the time of the read operation, one of the seven kinds of read voltages $V_{CGGR}$, $V_{CGFR}$, $V_{CGER}$, $V_{CGDR}$, $V_{CGCR}$, $V_{CGBR}$, $V_{CGAR}$ was supplied to the selected word line $WL_S$, or a plurality of voltages of these seven kinds of read voltages were supplied in order from largest one to smallest one to the selected word line $WL_S$. On the other hand, at a time of the verify operation, one of seven kinds of verify voltages $V_{VFYG}$, $V_{VFYF}$, $V_{VFYE}$, $V_{VFYD}$, $V_{VFYC}$, $V_{VFYB}$, $V_{VFYA}$ (FIG. 14(a)) is supplied to the selected word line $WL_S$, or a plurality of voltages of these seven kinds of verify voltages are supplied in order from largest one to smallest one to the selected word line $WL_S$. Note that timings $T_{141}$ through $T_{147}$ in FIG. 19 are timings corresponding to the timings $T_{121}$ through $T_{127}$ in FIG. 15B.

Moreover, in the verify operation, detection of ON state/OFF state for the prohibited memory cell MC may be omitted. In such a case, for example, at the time of the verify operation, "H" is latched in the latch circuit SDL connected to the write memory cell MC, and "L" is latched in the latch circuit SDL connected to the prohibited memory cell MC.

Moreover, in the verify operation, the data detected by the sense amplifier module SAM is transferred not to the control die CD, but to an unillustrated counter circuit.

In step S104 (FIG. 17), a result of the verify operation is determined. For example, in such a case as when a certain number or more of "L" data items are included in the data held in the latch circuit XDL, verify FAIL is determined, and processing proceeds to step S105. On the other hand, in such a case as when a certain number or more of "L" data items are not included in the data held in the latch circuit XDL, verify PASS is determined, and processing proceeds to step S107.

In step S105, it is determined whether the loop count k has reached a certain number K, or not. If the certain number K has not been reached, then processing proceeds to step S106. If the certain number K has been reached, then processing proceeds to step S108.

In step S106, 1 is added to the loop count k, and processing proceeds to step S102. Moreover, in step S106, for example, a certain voltage ΔV is added to the program voltage $V_{PGM}$.

In step S107, status data to the effect that the write sequence has ended normally is stored in the status register STR (FIG. 2), the status data is outputted to the control die CD (FIG. 1), and the write sequence is ended.

In step S108, status data to the effect that the write sequence has not ended normally is stored in the status register STR (FIG. 2), the status data is outputted to the control die CD (FIG. 1), and the write sequence is ended.

FIRST COMPARATIVE EXAMPLE

Figure 21:
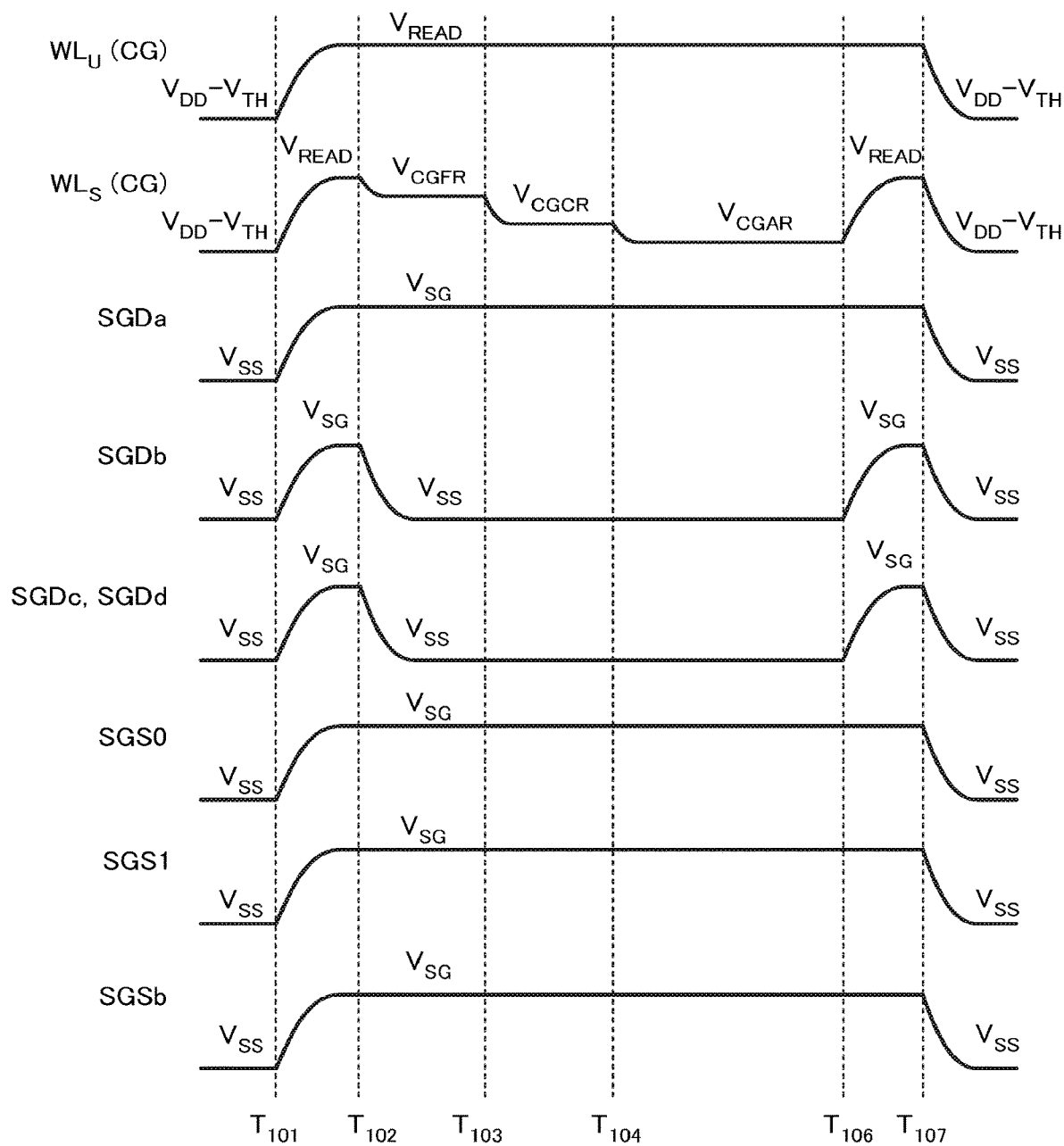
FIG. 21 is a schematic waveform diagram for explaining a read operation according to a first comparative example.

Next, a read operation of a semiconductor memory device according to a first comparative example will be described with reference to FIG. 21. FIG. 21 is a schematic waveform diagram for explaining same read operation. In the example of FIG. 21, the memory cell MC is assigned with data according to the 1-3-3 code of FIG. 14(b), and read of the middle bit data is executed. Moreover, timings $T_{101}$ through $T_{107}$ in FIG. 21 are timings corresponding to the timings $T_{121}$ through $T_{127}$ in FIG. 15B.

As shown in FIG. 21, the read operation of the semiconductor memory device according to the first comparative example is basically executed similarly to the read operation of the semiconductor memory device according to the first embodiment (refer to FIG. 15B). However, in the first comparative example, the drain side select gate lines SGDc, SGDd are controlled in a similar manner to the drain side select gate line SGDb. Moreover, in the first comparative example, the source side select gate line SGS1 is controlled in a similar manner to the source side select gate line SGS0.

SECOND COMPARATIVE EXAMPLE

Figure 22:
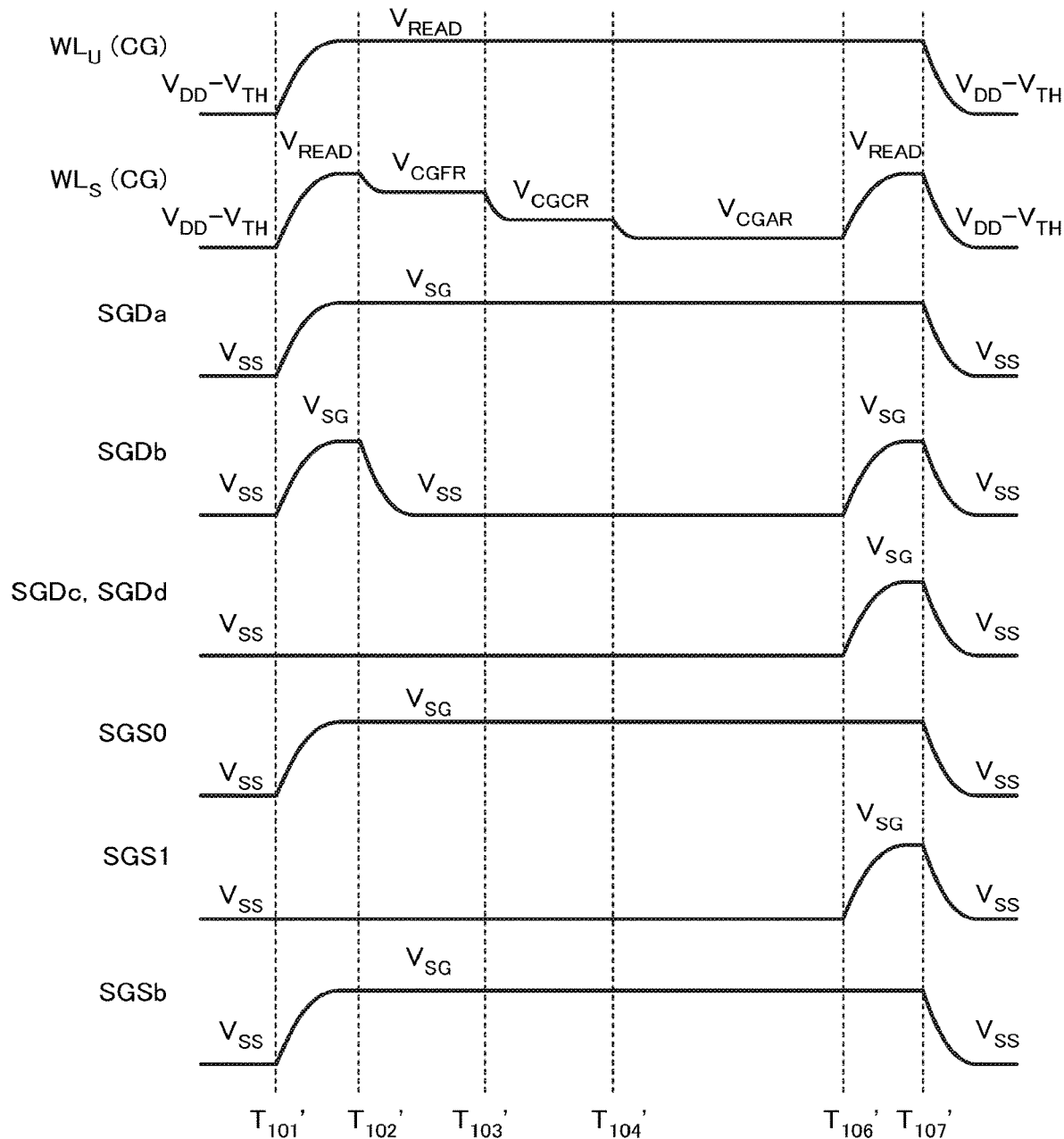
FIG. 22 is a schematic waveform diagram for explaining a second comparative example.

Next, a read operation of a semiconductor memory device according to a second comparative example will be described with reference to FIG. 22. FIG. 22 is a schematic waveform diagram for explaining same read operation. In the example of FIG. 22, the memory cell MC is assigned with data according to the 1-3-3 code of FIG. 14(b), and read of the middle bit data is executed. Note that timings $T_{101}'$ through $T_{107}'$ in FIG. 22 are timings corresponding to the timings $T_{121}$ through $T_{127}$ in FIG. 15B.

As shown in FIG. 22, the read operation of the semiconductor memory device according to the second comparative example is basically executed similarly to the read operation of the semiconductor memory device according to the first embodiment (refer to FIG. 15B). However, in the second comparative example, from timing $T_{101}'$ to timing $T_{106}'$, the drain side select gate lines SGDc, SGDd and the source side select gate line SGS1 are supplied with the ground voltage $V_{SS}$.

[Advantages of Read Operation According to First Embodiment]

In the read operation according to the first comparative example (FIG. 21), at a timing between timing $T_{101}$ and timing $T_{102}$, the memory cells MC and the select gate transistors (STD, STS, STSb) corresponding to the string units SUa, SUb, SUc, SUd attain an ON state (refer to FIG. 16C). In such a case, the channels of the memory cells MC and the select gate transistors (STD, STS, STSb) corresponding to the string units SUa, SUb, SUc, SUd are electrically continuous with the bit line BL and the source line SL, and their voltages are fixed. When, in such a state, the word line WL is charged from the voltage $V_{DD}$-$V_{TH}$ to the read pass voltage $V_{READ}$, sometimes, due to an effect of electrostatic capacitance between the channel of the memory cell MC and the word line WL, an amount of charge required for charging ends up increasing, and a comparatively large current ends up flowing in the charge pump circuit 32 (FIG. 5). As a result, sometimes, a comparatively large current ends up flowing in the pad electrode P.

On the other hand, in the read operation according to the first embodiment, as described with reference to the likes of FIG. 15B, for example, at the timing between timing $T_{121}$ and timing $T_{122}$, the memory cells MC included in the string units SUa, SUb and the select gate transistors (STD, STS, STSb) corresponding to the string units SUa, SUb attain an ON state. Moreover, the drain side select transistors STD and source side select transistors STS corresponding to the string units SUc, SUd attain an OFF state. In such a case, as shown in FIG. 16A, for example, the channels of the memory cells MC included in the string units SUc, SUd are separated both from the bit line BL and from the source line SL, and electrically attain a floating state. When, in such a state, the word line WL is charged from the voltage $V_{DD}$-$V_{TH}$ to the read pass voltage $V_{READ}$, an effect of electrostatic capacitance between the channels of the memory cells MC included in the string units SUc, SUd and the word line WL is extremely small. Hence, the amount of charge required for charging becomes smaller than in the first comparative example, and a maximum value of current flowing in the charge pump circuit 32 (FIG. 5) also becomes smaller than in the first comparative example. Hence, a maximum value of current flowing in the pad electrode P from timing $T_{121}$ to timing $T_{122}$ is smaller than a maximum value of current flowing in the pad electrode P from timing $T_{101}$ to timing $T_{102}$ in the first comparative example.

Moreover, in the read operation according to the first embodiment, as described with reference to the likes of FIG. 15B, for example, voltage of the word lines WL is increased to the read pass voltage $V_{READ}$, and the drain side select gate lines SGDc, SGDd and source side select gate line SCS1 corresponding to the string units SUc, SUd are supplied with the ground voltage $V_{SS}$, from timing $T_{121}$ to timing $T_{124}$. In such a case, the channels of the memory cells MC included in the string units SUc, SUd attain a floating state, and, due to an effect of electrostatic capacitance between themselves and the word line WL, undergo an increase in voltage to a certain voltage. Moreover, in the read operation according to the first embodiment, at the timing between timing $T_{124}$ and timing $T_{125}$, the drain side select gate lines SGDc, SGDd and source side select gate line SGS1 corresponding to the string units SUc, SUd are supplied with the voltage $V_{SG}$. As a result, as shown in FIG. 16D, for example, the channels of the memory cells MC in the string units SUc, SUd are connected to at least one of the bit line BL and the source line SL, and voltages of the channels of the memory cells MC decrease. In such a case, sometimes, due to an effect of electrostatic capacitance between the channel of the memory cell MC and the word line WL, the voltage of the word line WL decreases, and, to replenish this, the current flowing in the charge pump circuit 32 (FIG. 5) increases. As a result, sometimes, the current flowing in the pad electrode P increases. However, the maximum value of current flowing in the pad electrode P from timing $T_{124}$ to timing $T_{125}$ is smaller than the maximum value of current flowing in the pad electrode P from timing $T_{101}$ to timing $T_{102}$ in the first comparative example.

As indicated above, the read operation according to the first embodiment makes it possible for the maximum value of current flowing in the pad electrode P to be suppressed more compared to in the read operation according to the first comparative example.

Moreover, in the read operation according to the second comparative example (FIG. 22), the select gate transistors (STD, STS) corresponding to the string units SUc, SUd are in an OFF state, and the channels of those memory cells MC connected to the unselected word lines $WL_U$, of the plurality of memory cells MC included in the string units SUc, SUd electrically attain a floating state, from timing $T_{101}'$ to timing $T_{106}'$. Moreover, in the second comparative example, from timing $T_{101}'$ to timing $T_{102}'$, voltage of the unselected word lines $WL_U$ rises from the voltage $V_{DD}$-$V_{TH}$ to the read pass voltage $V_{READ}$, hence voltage of channels of the memory cells MC connected to the unselected word lines $WL_U$ becomes a comparatively large voltage due to capacitive coupling with the unselected word lines $WL_U$. Now, in the read operation according to the second comparative example, at timings $T_{102}'$, $T_{103}'$, $T_{104}'$, read voltages (for example, the read voltages $V_{CGFR}$, $V_{CGCR}$, $V_{CGAR}$) are supplied to the selected word line $WL_S$. Since the read voltages are smaller than the read pass voltage $V_{READ}$, a potential of channels of the memory cells MC connected to the selected word line $WL_S$ is lower than a potential of channels of the memory cells MC connected to the unselected word lines $WL_U$. Now, when such a difference in potential has reached a certain magnitude or more, sometimes, hot carriers end up occurring in vicinities of the memory cells MC connected to the selected word lines $WL_S$, and the threshold voltage of the memory cell MC positioned in this vicinity ends up fluctuating. Particularly, a difference between the likes of the read voltage $V_{CGAR}$ corresponding to the A state and read voltage $V_{CGBR}$ corresponding to the B state, and the read pass voltage $V_{READ}$, is large, and there sometimes readily occurs such a fluctuation in threshold voltage.

Now, in the read operation according to the first embodiment, as described with reference to the likes of FIG. 15B, for example, the select gate transistors (STD, STS) corresponding to the string units SUc, SUd are in an OFF state, and the channels of those memory cells MC connected to the unselected word lines $WL_U$, of the plurality of memory cells MC included in the string units SUc, SUd electrically attain a floating state, from timing $T_{121}$ to timing $T_{124}$. Moreover, at timings $T_{122}$, $T_{123}$, read voltages (for example, the read voltages $V_{CGFR}$, $V_{CGCR}$) are supplied to the selected word line $WL_S$. However, since the read voltages supplied at the timings $T_{122}$, $T_{123}$ are comparatively large, it is difficult for the above-mentioned kind of fluctuation in threshold voltage to occur.

Moreover, in the read operation according to the first embodiment, as described with reference to the likes of FIG. 15B, for example, at the timing between timing $T_{124}$ and timing $T_{125}$, the select gate transistors (STD, STS, STSb) corresponding to the string units SUc, SUd attain an ON state. In such a case, as shown in FIG. 16D, for example, at the timing between timing $T_{124}$ and timing $T_{125}$, the channels of those unselected memory cells MC connected to the unselected word lines $WL_S$, of the unselected memory cells MC included in the string units SUc, SUd are connected to at least one of the bit line BL and the source line SL. Hence, a voltage of channels of these unselected memory cell MC is adjusted to the voltage $V_{DD}$, the ground voltage $V_{SS}$, or a voltage of magnitude between these voltages $V_{DD}$, $V_{SS}$. As a result, the above-mentioned kind of difference in potential is relieved, and it is thereby possible for fluctuation in threshold voltage to be suppressed.

Second Embodiment

Figure 23:
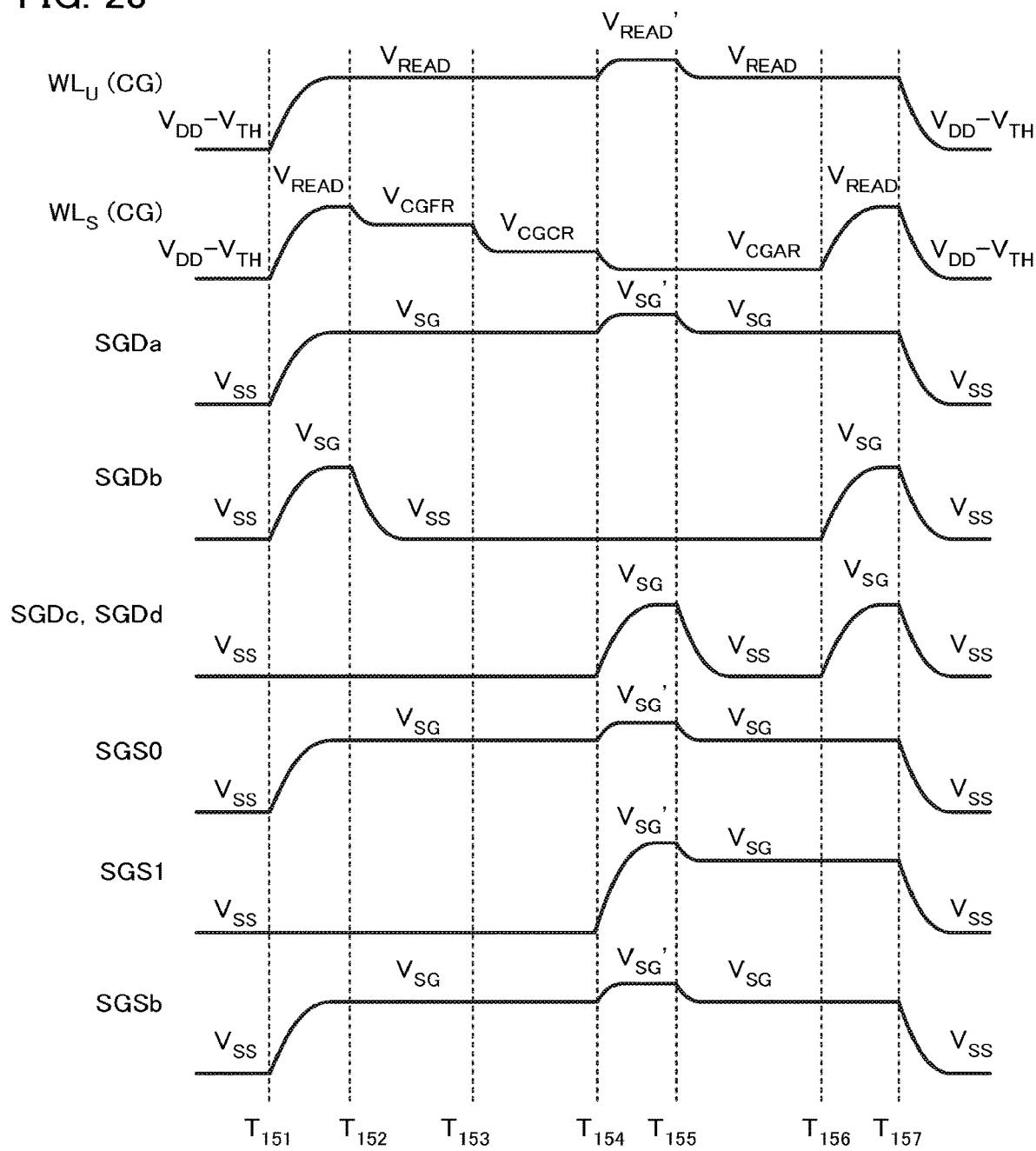
FIG. 23 is a schematic waveform diagram for explaining a read operation according to a second embodiment.

Next, a read operation of a semiconductor memory device according to a second embodiment will be described with reference to FIG. 23. FIG. 23 is a schematic waveform diagram for explaining same read operation. In the example of FIG. 23, the memory cell MC is assigned with data according to the 1-3-3 code of FIG. 14(b), and read of the middle bit data is executed. Moreover, timings $T_{151}$ through $T_{157}$ in FIG. 23 are timings corresponding to the timings $T_{121}$ through $T_{127}$ in FIG. 15B.

As shown in FIG. 23, the read operation of the semiconductor memory device according to the second embodiment is basically executed similarly to the read operation of the semiconductor memory device according to the first embodiment (refer to FIG. 15B). However, in the second embodiment, from timing $T_{154}$ to timing $T_{155}$, the unselected word lines $WL_U$ are supplied with a voltage $V_{READ}'$ which is larger than the read pass voltage $V_{READ}$, and the drain side select gate line SGDa and source side select gate lines SGS0, SGS1, SGSb are supplied with a voltage $V_{SG}'$ which is larger than the voltage $V_{SG}$.

Other Embodiments

That concludes description of the semiconductor memory devices according to the first and second embodiments. However, the semiconductor memory devices according to these embodiments are merely exemplifications, and specific configurations, operations, and so on, thereof may be appropriately adjusted.

For example, in the example of FIG. 15A, at timing $T_{114}$ of the read operation, voltages of the word lines WL and the select gate lines (SGD, SGS, SGSb) are simultaneously stepped down. However, such a mode is merely an exemplification, and a specific mode may be appropriately adjusted. For example, a timing at which the voltage of the word lines WL is stepped down may be later than a timing at which the voltage of the select gate lines (SGD, SGS, SGSb) is stepped down. The same applies also to the examples of FIGS. 15B, 15C, 19, and 23.

Moreover, for example, in the memory die MD according to the first embodiment, the conductive layer 110 and the semiconductor layer 120 were provided in the device layer DL, as described with reference to the likes of FIG. 9. Moreover, as described with reference to the likes of FIG. 11A, the lower end of the semiconductor layer 120 was connected to the P type well region 100P of the semiconductor substrate 100 via the semiconductor layer 122. Moreover, the transistor Tr (FIG. 9) was formed in the device layer DL. However, such a structure is merely an exemplification, and the read operation according to the first embodiment is applicable to a variety of configurations.

Figure 24:
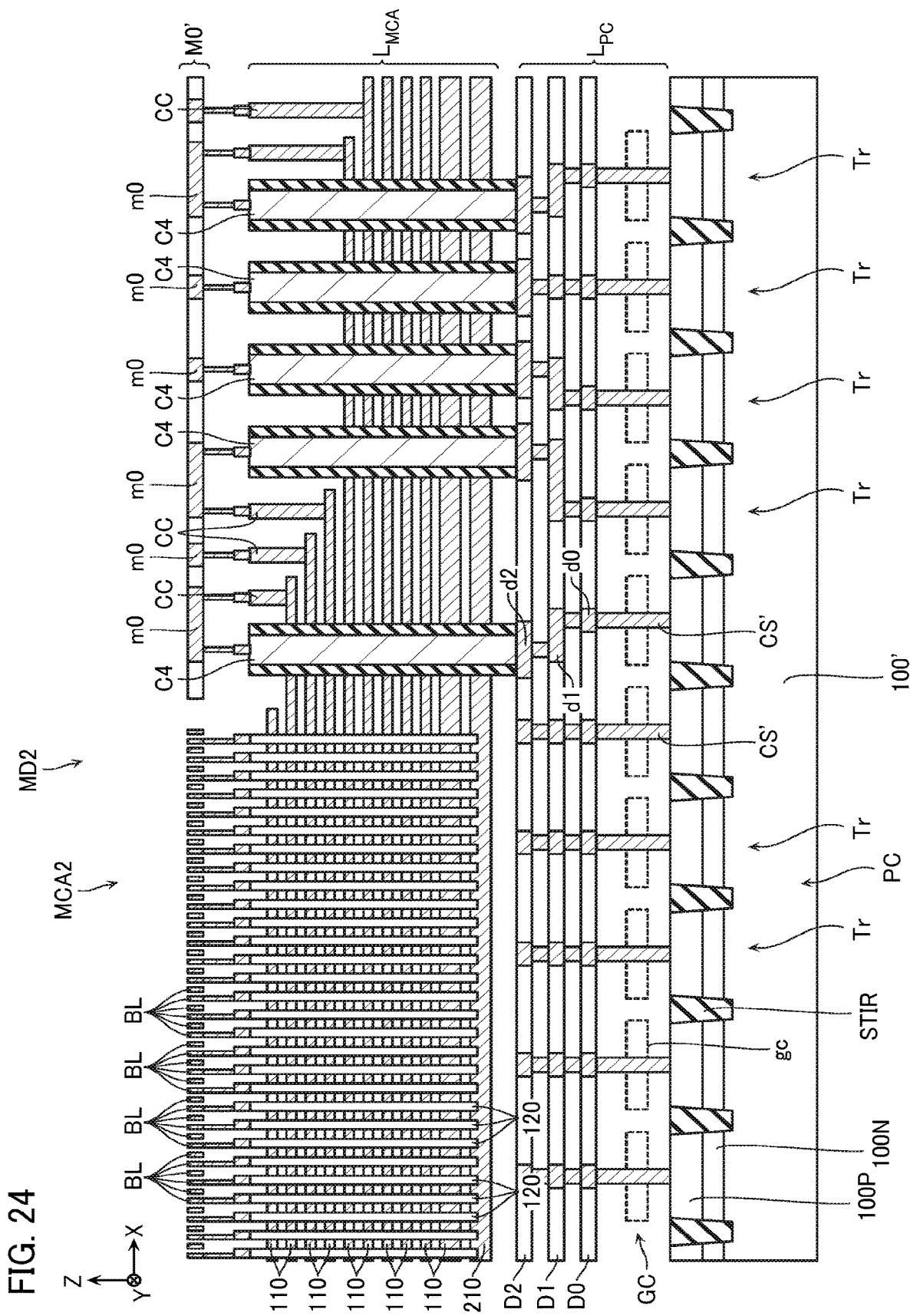
FIG. 24 is schematic cross-sectional view of a memory die MD2.

For example, a memory die MD2 according to FIG. 24 comprises a semiconductor substrate 100', and a peripheral circuit layer $L_{PC}$, a memory cell array layer $L_{MCA}$, a wiring layer M0', and an unillustrated wiring layer that are sequentially provided above the semiconductor substrate 100'. The semiconductor substrate 100' is basically configured similarly to the semiconductor substrate 100 according to the first embodiment. However, in the semiconductor substrate 100', each of configurations of the peripheral circuit PC are disposed in a layout that differs from the layout of the kind described with reference to FIG. 8. The peripheral circuit layer $L_{PC}$ is for example provided with configurations corresponding to the configurations in the peripheral region PR of the memory die MD according to the first embodiment. For example, the peripheral circuit layer $L_{PC}$ is provided with a wiring layer GC and wiring layers D0, D1, D2. The wiring layers D0, D1, D2 respectively include pluralities of wirings d0, d1, d2. These pluralities of wirings d0, d1, d2 may each include for example a laminated film of a barrier conductive film of the likes of titanium nitride (TiN) and a metal film of the likes of tungsten (W), or the like. The memory cell array layer $L_{MCA}$ is for example provided with configurations corresponding to the configurations in the memory cell array region MCAR, the first hookup region HUR1 (FIG. 8), and the second hookup region HUR2 (FIG. 8) of the memory die MD according to the first embodiment. For example, the memory cell array layer $L_{MCA}$ comprises: the plurality of conductive layers 110 aligned in the Z direction; and the plurality of semiconductor layers 120 extending in the Z direction. Moreover, although illustration thereof is omitted in FIG. 24, the gate insulating film 130 (FIG. 11A) is provided between the conductive layers 110 and the semiconductor layer 120. Moreover, the conductive layer 210 is provided below the conductive layers 110. The conductive layer 210 functions as the source line SL (FIG. 5). Moreover, the memory cell array layer $L_{MCA}$ comprises a contact C4 that extends in the Z direction penetrating a plurality of the conductive layers 110 and the conductive layer 210. The contact C4 electrically connects configurations such as wirings included in the likes of the wiring layer M0' and configurations in the peripheral circuit layer $L_{PC}$. The wiring layer M0' is basically configured similarly to the wiring layer M0 according to the first embodiment. However, the wiring layer M0' may include a laminated film of a barrier conductive film of the likes of titanium nitride (TiN) and a metal film of the likes of copper (Cu), or the like. Moreover, the wiring layer M0' includes the bit line BL.

A method of reading according to the first embodiment may also be applied to such a memory die MD2, for example.

Moreover, in the memory die MD according to the first embodiment (FIG. 9) and the memory die MD2 exemplified in FIG. 24, for example, the plurality of transistors Tr configuring the peripheral circuit PC, and the configurations such as the conductive layers 110, semiconductor layers 120, and gate insulating films 130 configuring the memory cell array MCA are formed on the same substrate. However, such a structure is merely an exemplification, and the read operation according to the first embodiment is applicable to a variety of configurations.

Figure 25:
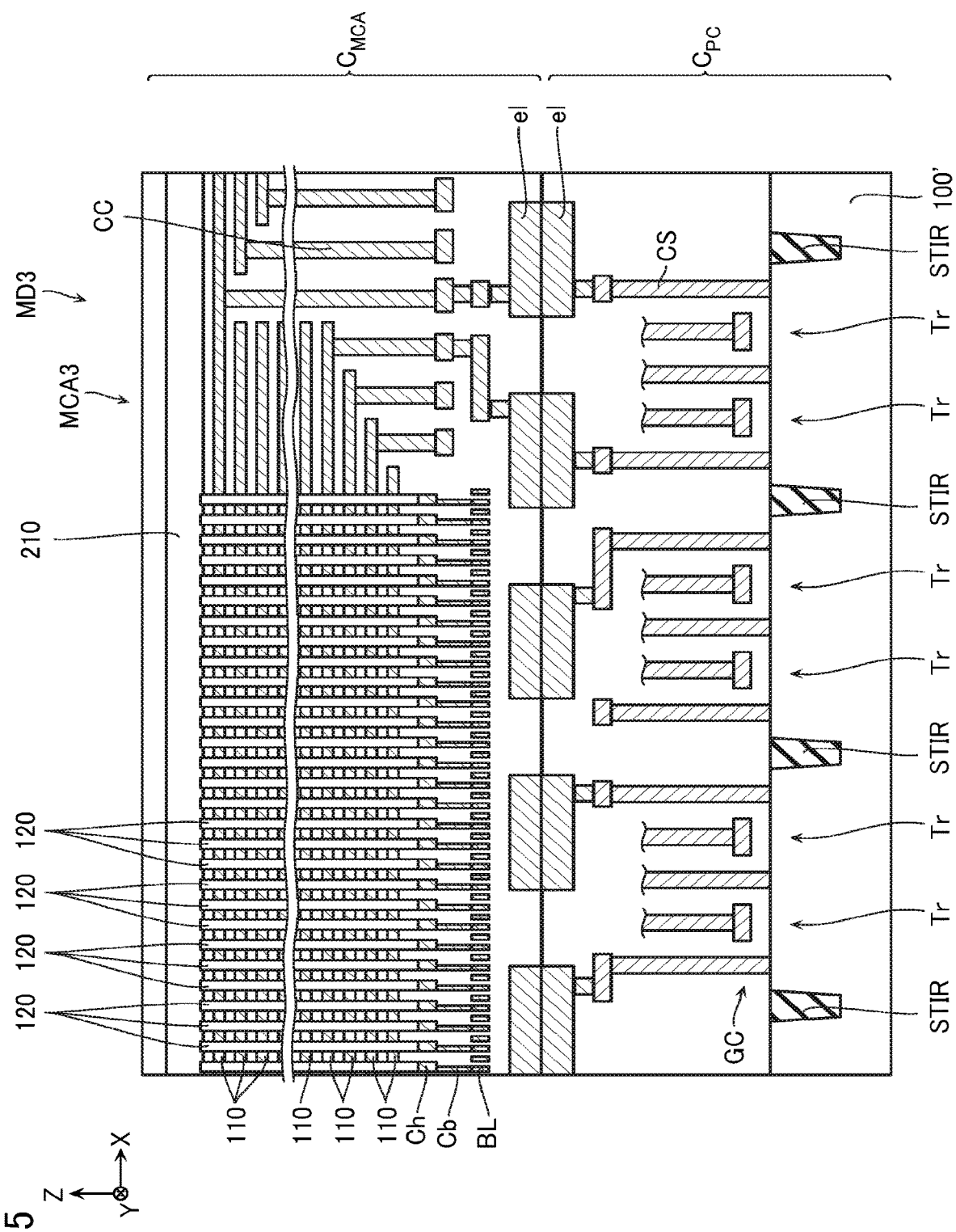
FIG. 25 is schematic cross-sectional view of a memory die MD3.

For example, a memory die MD3 according to FIG. 25 comprises a peripheral circuit chip $C_{PC}$ and a memory cell array chip $C_{MCA}$ that have been bonded to each other via bonding electrodes e1. The peripheral circuit chip $C_{PC}$ is for example provided with configurations corresponding to the configurations in the peripheral region PR of the memory die MD according to the first embodiment. The memory cell array chip $C_{MCA}$ is for example provided with configurations corresponding to the configurations in the memory cell array region MCAR, the first hookup region HUR1 (FIG. 8), and the second hookup region HUR2 (FIG. 8) of the memory die MD according to the first embodiment.

The method of reading according to the first embodiment may also be applied to such a memory die MD3, for example.

OTHERS

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a bit line;
    a source line;
    a first memory cell, a first select transistor, and a second select transistor, the first select transistor being connected between the first memory cell and the bit line, and the second select transistor being connected between the first memory cell and the source line;
    a second memory cell, a third select transistor, and a fourth select transistor, the third select transistor being connected between the second memory cell and the bit line, and the fourth select transistor being connected between the second memory cell and the source line;
    a first wiring electrically connected to the first memory cell and the second memory cell;
    a second wiring connected to a gate electrode of the first select transistor;
    a third wiring connected to a gate electrode of the second select transistor;
    a fourth wiring connected to a gate electrode of the third select transistor; and
    a fifth wiring connected to a gate electrode of the fourth select transistor,
    at a first timing, of a read operation on the first memory cell, voltages of the first wiring, the second wiring, and the third wiring being larger than voltages of the fourth wiring and the fifth wiring,
    at a second timing later than the first timing, of the read operation on the first memory cell, a voltage of the first wiring being smaller than a voltage of the first wiring at the first timing, and voltages of the second wiring and the third wiring being larger than voltages of the fourth wiring and the fifth wiring,
    at a third timing later than the second timing, of the read operation on the first memory cell, voltages of the fourth wiring and the fifth wiring being larger than voltages of the fourth wiring and the fifth wiring at the second timing, and
    at a fourth timing later than the third timing, of the read operation on the first memory cell, a voltage of the first wiring being smaller than a voltage of the first wiring at the first timing, and voltages of the second wiring and the third wiring being larger than a voltage of the fourth wiring.

2. The semiconductor memory device according to claim 1, wherein
    a voltage of the first wiring at the third timing is smaller than a voltage of the first wiring at the second timing.

3. The semiconductor memory device according to claim 1, wherein
    a voltage of the first wiring at the fourth timing is smaller than a voltage of the first wiring at the second timing.

4. The semiconductor memory device according to claim 3, wherein
    a voltage of the first wiring at a fifth timing later than the second timing and earlier than the third timing is smaller than a voltage of the first wiring at the second timing, and is larger than a voltage of the first wiring at the fourth timing.

5. The semiconductor memory device according to claim 1, wherein
    at the fourth timing, a voltage of the fifth wiring is larger than a voltage of the fourth wiring.

6. The semiconductor memory device according to claim 1, wherein
    at a sixth timing later than the fourth timing, voltages of the first through fifth wirings are larger than voltages of the fourth wiring and the fifth wiring at the second timing.

7. The semiconductor memory device according to claim 1, comprising:
    a third memory cell, a fifth select transistor, and a sixth select transistor, the fifth select transistor being connected between the third memory cell and the bit line, and the sixth select transistor being connected between the third memory cell and the source line; and
    a sixth wiring connected to a gate electrode of the fifth select transistor, wherein
    the first wiring is electrically connected to the third memory cell,
    the third wiring is connected to a gate electrode of the sixth select transistor,
    at the first timing, of the read operation on the first memory cell, a voltage of the sixth wiring is larger than voltages of the fourth wiring and the fifth wiring,
    at the second timing, of the read operation on the first memory cell, a voltage of the sixth wiring is smaller than voltages of the second wiring and the third wiring, and
    at the fourth timing, of the read operation on the first memory cell, a voltage of the sixth wiring is smaller than voltages of the second wiring and the third wiring.

8. The semiconductor memory device according to claim 7, wherein
    at the third timing, a voltage of the sixth wiring is smaller than voltages of the second wiring and the third wiring.

9. The semiconductor memory device according to claim 7, wherein
at a sixth timing later than the fourth timing, voltages of the first through sixth wirings are larger than voltages of the fourth wiring and the fifth wiring at the second timing.

10. The semiconductor memory device according to claim 1, comprising:
a fourth memory cell connected between the first select transistor and the second select transistor;
a fifth memory cell connected between the third select transistor and the fourth select transistor; and
a seventh wiring electrically connected to the fourth memory cell and the fifth memory cell, wherein
at the first timing, a voltage of the seventh wiring is larger than voltages of the fourth wiring and the fifth wiring,
at the second timing, a voltage of the seventh wiring is larger than voltages of the fourth wiring and the fifth wiring,
at the third timing, a voltage of the seventh wiring is larger than a voltage of the fourth wiring at the first timing and the second timing, and
at the fourth timing, a voltage of the seventh wiring is larger than a voltage of the fourth wiring.

11. The semiconductor memory device according to claim 10, wherein
a voltage of the second wiring at the third timing is larger than a voltage of the second wiring at the fourth timing,
a voltage of the third wiring at the third timing is larger than a voltage of the third wiring at the fourth timing, and
a voltage of the seventh wiring at the third timing is larger than a voltage of the seventh wiring at the fourth timing.

12. The semiconductor memory device according to claim 1, wherein
a voltage of the second wiring at the third timing is larger than a voltage of the second wiring at the fourth timing, and
a voltage of the third wiring at the third timing is larger than a voltage of the third wiring at the fourth timing.

13. The semiconductor memory device according to claim 12, wherein
a voltage of the fifth wiring at the third timing is larger than a voltage of the fifth wiring at the fourth timing.

14. A semiconductor memory device comprising:
a bit line;
a source line;
a first memory cell, a first select transistor, and a second select transistor, the first select transistor being connected between the first memory cell and the bit line, and the second select transistor being connected between the first memory cell and the source line;
a second memory cell, a third select transistor, and a fourth select transistor, the third select transistor being connected between the second memory cell and the bit line, and the fourth select transistor being connected between the second memory cell and the source line;
a first wiring electrically connected to the first memory cell and the second memory cell;
a second wiring connected to a gate electrode of the first select transistor;
a third wiring connected to a gate electrode of the second select transistor;
a fourth wiring connected to a gate electrode of the third select transistor; and
a fifth wiring connected to a gate electrode of the fourth select transistor,
in a write sequence on the first memory cell, there being executed a program operation and a verify operation,
at a first timing, of the verify operation, voltages of the first wiring, the second wiring, and the third wiring being larger than voltages of the fourth wiring and the fifth wiring,
at a second timing later than the first timing, of the verify operation, a voltage of the first wiring being smaller than a voltage of the first wiring at the first timing, and voltages of the second wiring and the third wiring being larger than voltages of the fourth wiring and the fifth wiring,
at a third timing later than the second timing, of the verify operation, voltages of the fourth wiring and the fifth wiring being larger than voltages of the fourth wiring and the fifth wiring at the second timing, and
at a fourth timing later than the third timing, of the verify operation, a voltage of the first wiring being smaller than a voltage of the first wiring at the first timing, and voltages of the second wiring and the third wiring being larger than a voltage of the fourth wiring.

15. The semiconductor memory device according to claim 14, wherein
a voltage of the first wiring at the third timing is smaller than a voltage of the first wiring at the second timing.

16. The semiconductor memory device according to claim 14, wherein
a voltage of the first wiring at the fourth timing is smaller than a voltage of the first wiring at the second timing.

17. The semiconductor memory device according to claim 16, wherein
a voltage of the first wiring at a fifth timing later than the second timing and earlier than the third timing is smaller than a voltage of the first wiring at the second timing, and is larger than a voltage of the first wiring at the fourth timing.

18. The semiconductor memory device according to claim 14, wherein
at the fourth timing, a voltage of the fifth wiring is larger than a voltage of the fourth wiring.

19. The semiconductor memory device according to claim 14, wherein
at a sixth timing later than the fourth timing, voltages of the first through fifth wirings are larger than voltages of the fourth wiring and the fifth wiring at the second timing.

* * * * *